US012802620B2

(12) United States Patent
Lee

(10) Patent No.: US 12,802,620 B2
(45) Date of Patent: Nov. 17, 2026

(54) SCAN DRIVER INCLUDING ELECTRODE PATTERN PASSING THROUGH ETCHED SEMICONDUCTOR PATTERN AND DISPLAY DEVICE INCLUDING THE SAME

(71) Applicant: Samsung Display Co., LTD., Yongin-si (KR)

(72) Inventor: Chang Yeol Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 29 days.

(21) Appl. No.: 18/952,896

(22) Filed: Nov. 19, 2024

(65) Prior Publication Data

US 2025/0232708 A1 Jul. 17, 2025

(30) Foreign Application Priority Data

Jan. 12, 2024 (KR) ........................ 10-2024-0005417

(51) Int. Cl.
*G09G 3/3266* (2016.01)
*G09G 3/32* (2016.01)
(Continued)

(52) U.S. Cl.
CPC ............. *G09G 3/32* (2013.01); *G09G 3/3266* (2013.01); *G09G 3/3233* (2013.01); (Continued)

(58) Field of Classification Search
CPC ...... G09G 3/20; G09G 3/3266; G09G 3/3233; G09G 2300/0426; G09G 2310/0267; H10K 59/131; H10D 86/441
See application file for complete search history.

(56) References Cited

U.S. PATENT DOCUMENTS 9,520,455 B2 12/2016 Oh et al.
11,502,111 B2 11/2022 Lee et al.
(Continued)

FOREIGN PATENT DOCUMENTS

KR 10-1195720 10/2012
KR 10-2021-0152101 12/2021
(Continued)

*Primary Examiner* — Adam J Snyder

(74) *Attorney, Agent, or Firm* — F. CHAU & ASSOCIATES, LLC

(57) ABSTRACT

A display device includes a plurality of first semiconductor transistors having a first semiconductor layer and a semiconductor pattern; and a plurality of second semiconductor transistors having a second semiconductor layer and a semiconductor pattern. A first electrode layer is located between the first semiconductor layer and the second semiconductor layer, a second electrode layer is located on the second semiconductor layer. A first transistor among the second semiconductor transistors includes a first semiconductor pattern located in the second semiconductor layer, a bridge pattern located in the first electrode layer, and an electrode pattern located in the second electrode layer. The first semiconductor pattern includes an etched portion, and the electrode pattern connects the first semiconductor pattern and the bridge pattern but passes through the etched portion of the first semiconductor pattern and contacts the bridge pattern.

18 Claims, 20 Drawing Sheets

(51) Int. Cl.
*G09G 3/3233* (2016.01)
*H10D 86/40* (2025.01)
*H10K 59/131* (2023.01)

(52) U.S. Cl.
CPC ............... *G09G 2300/0426* (2013.01); *G09G 2310/0267* (2013.01); *H10D 86/441* (2025.01); *H10K 59/131* (2023.02)

(56) References Cited

U.S. PATENT DOCUMENTS

| | | | | |
|---|---|---|---|---|
| 2006/0176628 | A1 | 8/2006 | Hasegawa et al. | |
| 2015/0021572 | A1* | 1/2015 | Amari | H10K 10/46 438/149 |
| 2016/0005804 | A1* | 1/2016 | Oh | H10K 10/486 438/239 |
| 2022/0208911 | A1 | 6/2022 | Cho et al. | |
| 2024/0395195 | A1* | 11/2024 | Ke | G09G 3/32 |

FOREIGN PATENT DOCUMENTS

| | | |
|---|---|---|
| KR | 10-2350398 | 1/2022 |
| KR | 10-2022-0096489 | 7/2022 |

* cited by examiner

SCAN DRIVER INCLUDING ELECTRODE PATTERN PASSING THROUGH ETCHED SEMICONDUCTOR PATTERN AND DISPLAY DEVICE INCLUDING THE SAME

CROSS-REFERENCE TO RELATED APPLICATION(S)

This application claims priority to and the benefits of Korean Patent Application No. 10-2024-0005417 under 35 U.S.C. § 119, filed on Jan. 12, 2024 in the Korean Intellectual Property Office, the contents of which are hereby incorporated by reference in its entirety.

BACKGROUND

1. Technical Field

The disclosure relates to a scan driver and a display device including the same.

2. Description of the Related Art

As information technology develops, the importance of a display device as a connection medium between a user and information is being emphasized. In response to this, the use of display devices such as liquid crystal display devices and organic light emitting display devices is increasing.

As resolution increases and the number of integrated elements increases in display devices, technology that can minimize dead space becomes necessary.

SUMMARY

A technical problem to be solved by the disclosure is to provide a scan driver that can minimize dead space by using a hydrogen exhaust port as a contact hole and a display device including the same.

A display device according to an embodiment may include a plurality of first semiconductor transistors having a first semiconductor layer and each semiconductor pattern of the first semiconductor transistors located in the first semiconductor layer; and a plurality of second semiconductor transistors having a second semiconductor layer and each semiconductor pattern of the second semiconductor transistors located in the second semiconductor layer on the first semiconductor layer. A first electrode layer may be located between the first semiconductor layer and the second semiconductor layer, a second electrode layer may be located on the second semiconductor layer, a first transistor among the second semiconductor transistors may include a first semiconductor pattern located in the second semiconductor layer, a bridge pattern located in the first electrode layer, and an electrode pattern located in the second electrode layer, the first semiconductor pattern may include an etched portion, and the electrode pattern may connect the first semiconductor pattern and the bridge pattern, but the electrode pattern may pass through the etched portion of the first semiconductor pattern and contact the bridge pattern.

The etched portion may be a notch or an opening.

The etched portion may be a hydrogen exhaust port.

The first semiconductor pattern may include a first electrode of the first transistor, and the electrode pattern may contact the first electrode of the first transistor.

The bridge pattern may be connected to an electrode of a transistor other than the first transistor.

The first semiconductor pattern may include a first electrode of the first transistor, the first electrode of the first transistor may include first sub-electrodes spaced apart from each other, the electrode pattern may include sub-electrode patterns spaced apart from each other, the sub-electrode patterns may contact corresponding first sub-electrodes, and the bridge pattern may connect the sub-electrode patterns.

The bridge pattern may be a scan line that connects a pixel and a scan driver.

The bridge pattern may be an emission line that connects a pixel and an emission driver.

A scan driver according to an embodiment may include a plurality of stages. Each of the plurality of stages may include a plurality of first semiconductor transistors having a first semiconductor layer and each semiconductor pattern of the first semiconductor transistors located in the first semiconductor layer; and a plurality of second semiconductor transistors having a second semiconductor layer and each semiconductor pattern of the second semiconductor transistors located in the second semiconductor layer on the first semiconductor layer. A first electrode layer may be located between the first semiconductor layer and the second semiconductor layer, a second electrode layer may be located on the second semiconductor layer, a first transistor among the second semiconductor transistors may include a first semiconductor pattern located in the second semiconductor layer, a bridge pattern located in the first electrode layer, and an electrode pattern located in the second electrode layer, the semiconductor pattern may include an etched portion, and the electrode pattern may connect the first semiconductor pattern and the bridge pattern, but the electrode pattern may pass through the etched portion of the first semiconductor pattern and contact the bridge pattern.

The etched portion may be a notch or an opening.

The etched portion may be a hydrogen exhaust port.

The first semiconductor pattern may include a first electrode of the first transistor, and the electrode pattern may contact the first electrode of the first transistor.

The bridge pattern may be connected to an electrode of a transistor other than the first transistor.

A second electrode of the first transistor may receive a scan start signal or a scan signal of a previous stage.

The first semiconductor pattern may include a first electrode of the first transistor, the first electrode of the first transistor may include first sub-electrodes spaced apart from each other, the electrode pattern may include sub-electrode patterns spaced apart from each other, the sub-electrode patterns may contact corresponding first sub-electrodes, and the bridge pattern may connect the sub-electrode patterns.

The first electrode of the first transistor may be connected to a gate electrode of at least one of the plurality of first semiconductor transistors.

The first electrode of the first transistor may be further connected to a gate electrode of at least one of the plurality of second semiconductor transistors.

The bridge pattern may be a scan line.

The first transistor may be connected to at least one of the plurality of first semiconductor transistors.

The first transistor may be connected to at least one of the plurality of first semiconductor transistors through the electrode pattern.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION OF THE EMBODIMENTS

Figure 1:
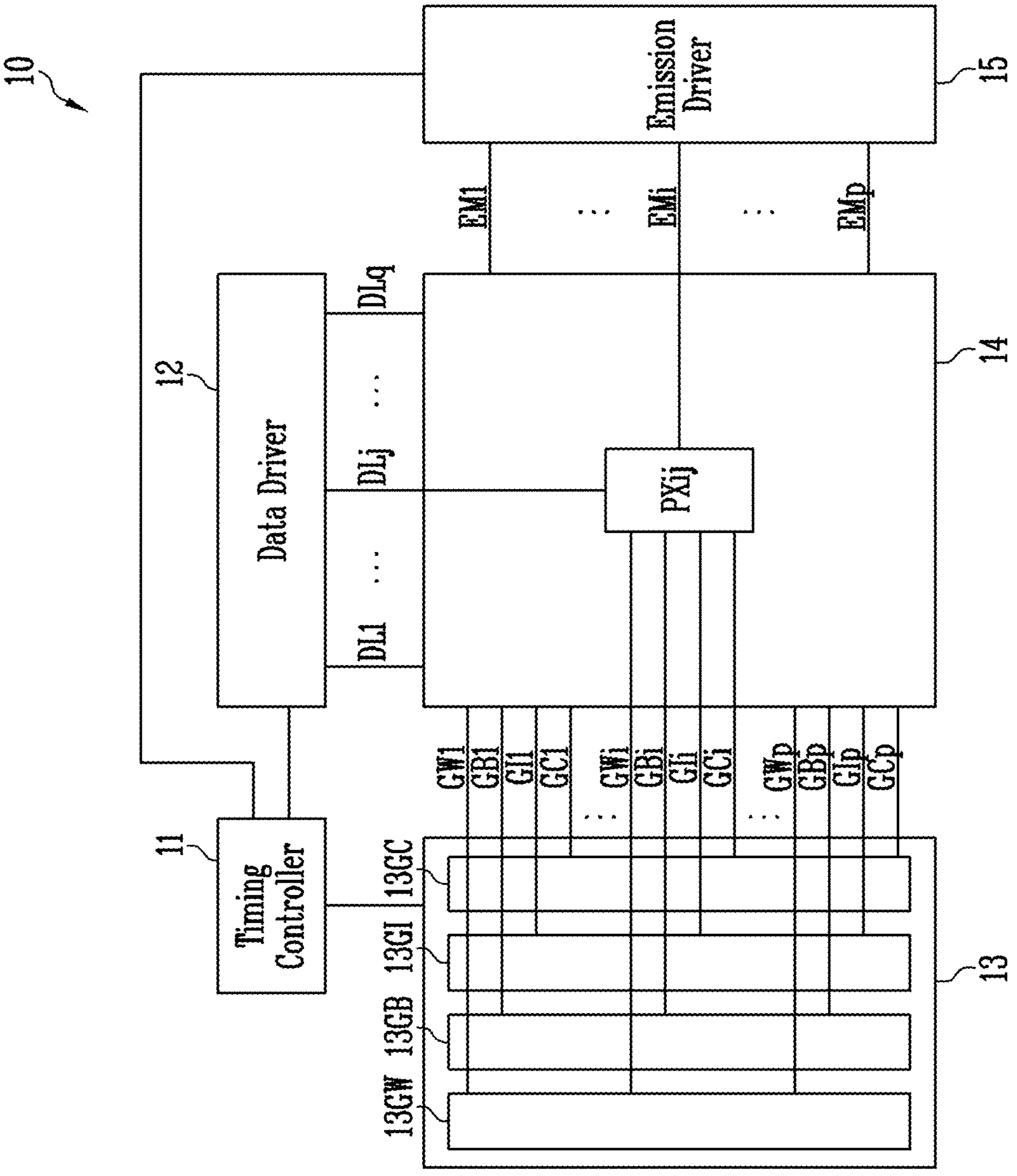
FIG. 1 is a schematic diagram for explaining a display device according to an embodiment.

Hereinafter, various embodiments will be described in detail with reference to the accompanying drawings so that those of ordinary skill in the art may easily implement the disclosure. The disclosure may be embodied in various different forms and is not limited to the embodiments described herein.

In order to clearly describe the disclosure, parts that are not related to the description are omitted, and the same or similar components are denoted by the same reference numerals throughout the specification. Therefore, the reference numerals described above may also be used in other drawings.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The size and thickness of each component shown in the drawings are arbitrarily shown for convenience of description, and thus the disclosure is not necessarily limited to those shown in the drawings. In the drawings, thicknesses may be exaggerated to clearly express the layers and regions.

In the description, the expression "is the same" may mean "substantially the same". For example, it may be the same enough to convince those of ordinary skill in the art to be the same. In other expressions, "substantially" may be omitted.

The term "dead space" as used herein may refer to an area or region that cannot be utilized for active components due to, for example, design considerations.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic diagram for explaining a display device according to an embodiment.

Referring to FIG. 1, a display device 10 according to an embodiment may include a timing controller 11, a data driver 12, a scan driver 13, a pixel unit 14, and an emission driver 15.

The timing controller 11 may receive grayscales for an input image or an input frame. The grayscales may include a first color grayscale, a second color grayscale, and a third color grayscale. The first color grayscale may be a grayscale for expressing a first color, the second color grayscale may be a grayscale for expressing a second color, and the third color grayscale may be a grayscale for expressing a third color.

The timing controller 11 may receive a control signal for an image. The control signal may include a horizontal synchronization signal Hsync, a vertical synchronization signal Vsync, and a data enable signal. The vertical synchronization signal may include pulses and may indicate that a previous frame period ends and a current frame period begins based on a time point in case that each pulse is generated. An interval between adjacent pulses of the vertical synchronization signal may correspond to one frame period. The horizontal synchronization signal may include pulses and may indicate that a previous horizontal period ends and a new horizontal period begins based on a time point in case that each pulse is generated. An interval between adjacent pulses of the horizontal synchronization signal may correspond to one horizontal period. The data enable signal may have an enable level for certain horizontal periods and a disable level for the remaining periods. In case that the data enable signal is at the enable level, it may indicate that color grayscales are supplied in the corresponding horizontal periods.

The timing controller 11 may provide grayscales rendered or corrected to meet the specifications of the display device 10 to the data driver 12. The timing controller 11 may provide a clock signal, a scan start signal, and the like to the scan driver 13. The timing controller 11 may provide a clock signal, an emission stop signal, and the like to the emission driver 15.

The data driver 12 may generate data voltages to be provided to data lines DL1, . . . , DLj, . . . , and DLq using grayscales and control signals received from the timing controller 11. For example, the data driver 12 may sample the grayscales using a clock signal and apply the data voltages corresponding to the grayscales to the data lines in units of pixel rows. Here, q may be an integer greater than 1, and j may be an integer greater than 0 and less than q.

The scan driver 13 may include first to fourth scan drivers 13GW, 13GB, 13GI, and 13GC. The first scan driver 13GW may provide first scan signals to first scan lines GW1, . . . , GWi, . . . , and GWp. Here, p may be an integer greater than 1, and i may be an integer greater than 0 and less than p. The second scan driver 13GB may provide second scan signals to second scan lines GB1, . . . , GBi, . . . , and GBp. The third scan driver 13GI may provide third scan signals to third scan lines GI1, . . . , GIi, . . . , and GIp. The fourth scan driver 13GC may provide the first scan signals to fourth scan lines GC1, . . . , GCi, . . . , and GCp.

For example, the first scan driver 13GW may receive at least one scan clock signal and the scan start signal from the timing controller 11 to generate the first scan signals to be provided to the first scan lines GW1 to GWp. The first scan driver 13GW may sequentially provide the first scan signals having a turn-on level pulse to the first scan lines GW1 to GWp. For example, the first scan driver 13GW may be configured in the form of a shift register. The first scan driver 13GW may generate the first scan signals by sequentially transmitting the scan start signal in the form of a turn-on level pulse to the next scan stage under the control of the scan clock signal.

Figure 4:
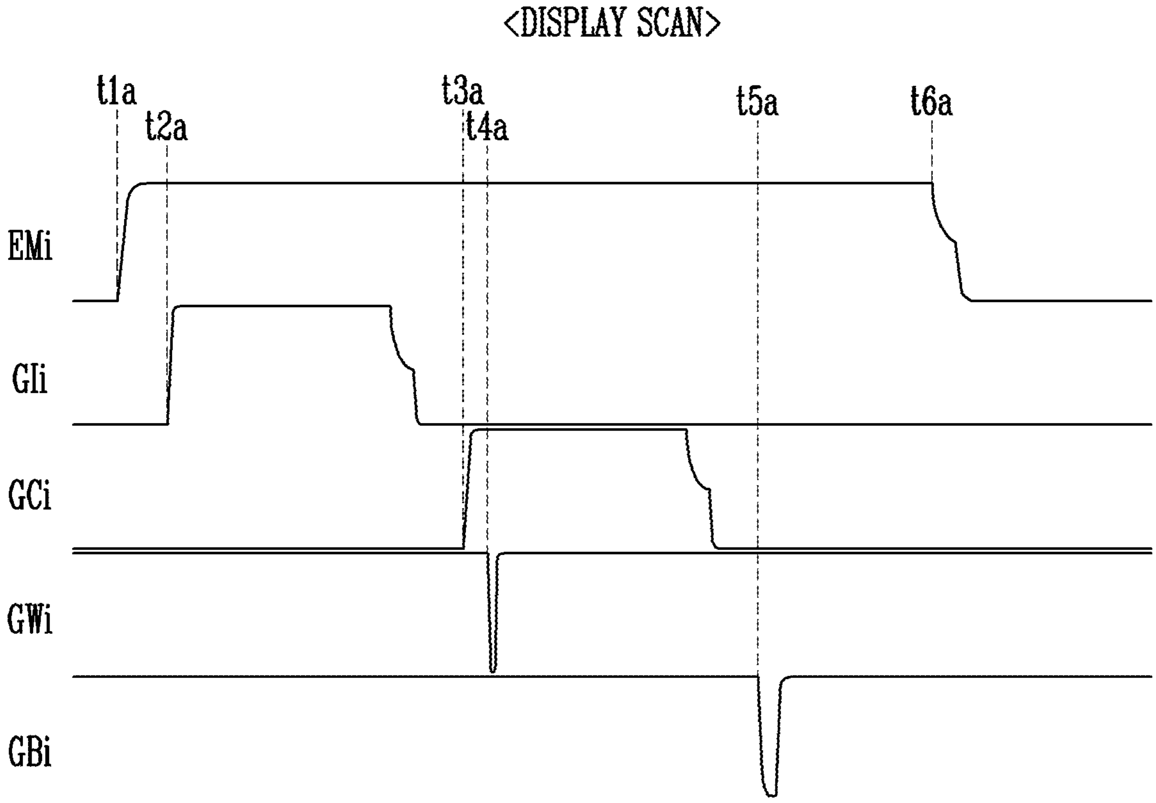
FIG. 4 is a schematic diagram for explaining a first scan period according to an embodiment.

Since each of the second scan driver 13GB, the third scan driver 13GI, and the fourth scan driver 13GC may be configured similarly to the first scan driver 13GW, overlapping descriptions will be omitted. According to an embodiment, at least some of the first to fourth scan drivers 13GW, 13GB, 13GI, and 13GC may be integrated. For example, in case that the polarity and width of pulses are the same, two or more scan drivers may be integrated. Referring to FIG. 4, since the polarity and width of a turn-on level pulse applied to a third scan line GIi at a time point t2*a* and a turn-on level pulse applied to a fourth scan line GCi at a time point t3*a* are the same, the third scan driver 13GI and the fourth scan driver 13GC may be integrated.

The emission driver 15 may receive at least one emission clock signal and the emission stop signal from the timing controller 11 to generate emission signals to be provided to emission lines EM1, . . . , EMi, . . . , and EMp. The emission driver 15 may sequentially provide the emission signals having a turn-off level pulse to the emission lines EM1 to EMp. For example, the emission driver 15 may be configured in the form of a shift register. The emission driver 15 may generate the emission signals by sequentially transmitting the emission stop signal in the form of a turn-off level pulse to the next emission stage under the control of the emission clock signal.

In FIG. 1, the number of each of the first scan lines GW1 to GWp, the second scan lines GB1 to GBp, the third scan lines GI1 to GIp, the fourth scan lines GC1 to GCp, and the emission lines EM1 to EMp is shown to be p. However, in another embodiment, the number of at least one of the second scan lines GB1 to GBp, the third scan lines GI1 to GIp, the fourth scan lines GC1 to GCp, and the emission lines EM1 to EMp may be p/2 or less. For example, two adjacent pixel rows may share one second scan line. Similarly, two adjacent pixel rows may share one third scan line, fourth scan line, or emission line. The same pixel row may refer to pixels connected to the same first scan line. Hereinafter, for convenience of description, a case where the number of each of the first scan lines GW1 to GWp, the second scan lines GB1 to GBp, the third scan lines GI1 to GIp, the fourth scan lines GC1 to GCp, and the emission lines EM1 to EMp is p will be described as an example.

The pixel unit 14 may include pixels. Each pixel PXij may be connected to a corresponding data line DLj, corresponding scan lines GWi, GBi, GIi, and GCi, and a corresponding emission line EMi. The pixel unit 14 may include first pixels that emit light of a first color, second pixels that emit light of a second color, and third pixels that emit light of a third color. The first color, the second color, and the third color may be different colors. For example, the first color may be one of red, green, and blue. The second color may be one of red, green, and blue other than the first color. The third color may be one of red, green, and blue other than the first and second colors. As the first to third colors, magenta, cyan, and yellow may be used instead of red, green, and blue.

The pixel unit 14 may have various arrangement forms such as diamond PENTILE™ RGB-Stripe, S-stripe, Real RGB, normal PENTILE™, or the like.

Figure 2:
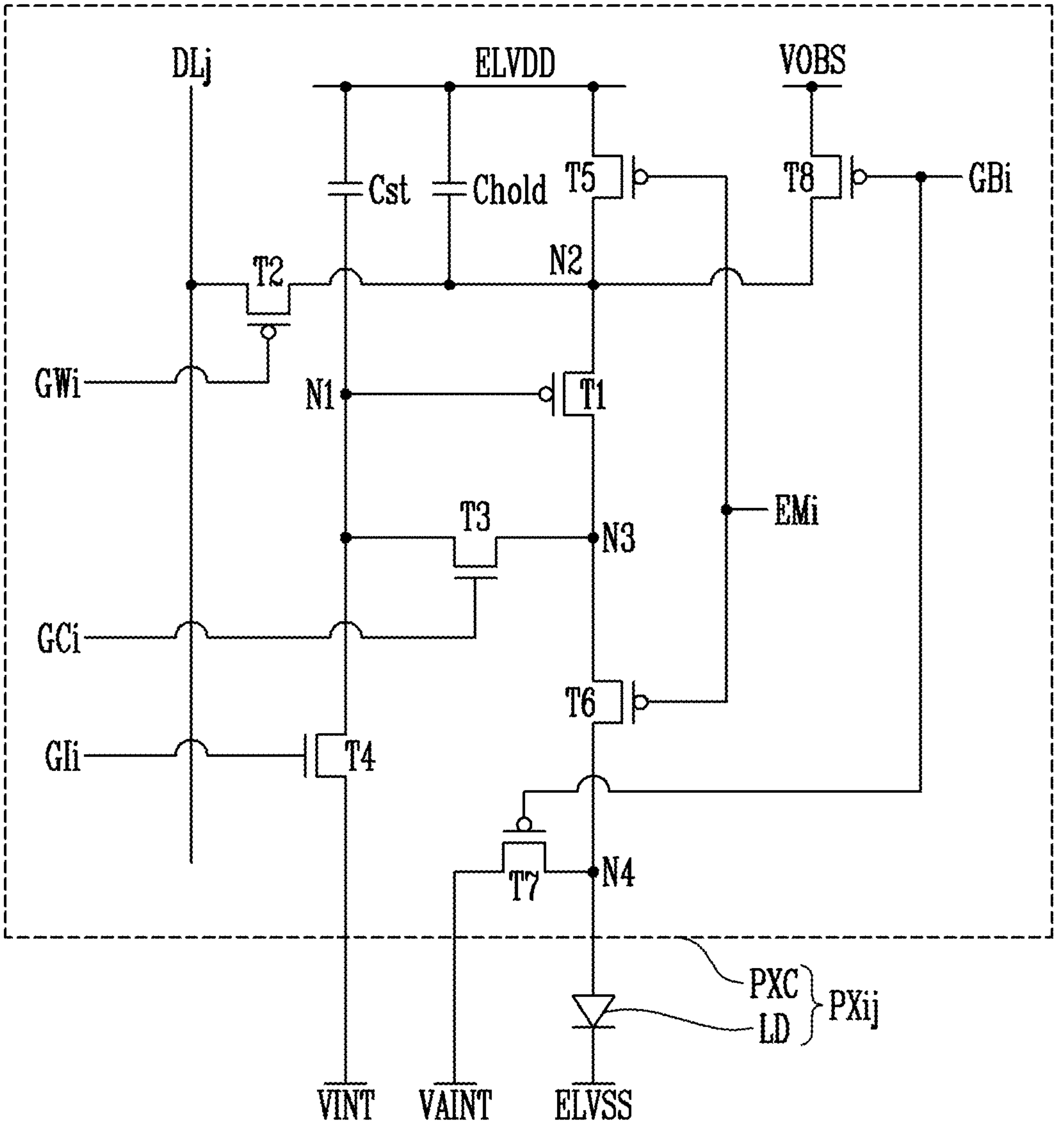
FIG. 2 is a schematic diagram for explaining a pixel according to an embodiment.

FIG. 2 is a schematic diagram for explaining a pixel according to an embodiment.

Referring to FIG. 2, the pixel PXij may include a pixel circuit PXC and a light emitting element LD. The pixel circuit PXC may include transistors T1, T2, T3, T4, T5, T6, T7, and T8, a storage capacitor Cst, and a hold capacitor Chold. According to an embodiment, the hold capacitor Chold and the eighth transistor T8 may be omitted.

The pixel PXij may be located in an i-th pixel row and a j-th pixel column. The pixel PXij may be a first pixel for expressing the first color. Since a second pixel for expressing the second color and a third pixel for expressing the third color may also be configured the same as the first pixel, overlapping descriptions will be omitted.

In the present embodiment, P-type transistors may be polysilicon semiconductor transistors. In a polysilicon semiconductor transistor, a channel of an active layer may include a polysilicon semiconductor. For example, the polysilicon semiconductor transistor may be a low temperature polysilicon LTPS thin film transistor. The polysilicon semiconductor transistor may have high electron mobility and thus may have fast driving characteristics.

In the present embodiment, N-type transistors may be oxide semiconductor transistors. In an oxide semiconductor transistor, a channel of an active layer may include an oxide semiconductor. For example, the oxide semiconductor transistor may be a low temperature polycrystalline oxide (LTPO) thin film transistor. The oxide semiconductor transistor may have lower charge mobility than the polysilicon semiconductor transistor. Accordingly, the amount of leakage current generated in case that the oxide semiconductor transistors are turned off may be smaller than that of the polysilicon semiconductor transistors.

A first transistor T1 may have a gate electrode connected to a first node N1, a first electrode connected to a second node N2, and a second electrode connected to a third node N3. The first transistor T1 may be a driving transistor. The first transistor T1 may be a P-type transistor.

A second transistor T2 may have a gate electrode connected to a first scan line GWi, a first electrode connected to a data line DLj, and a second electrode connected to the second node N2. The second transistor T2 may be a scanning transistor. The second transistor T2 may be a P-type transistor.

A third transistor T3 may have a gate electrode connected to a fourth scan line GCi, a first electrode connected to the first node N1, and a second electrode connected to the third node N3. The third transistor T3 may be a transistor connected in the form of a diode. The third transistor T3 may be an N-type transistor.

A fourth transistor T4 may have a gate electrode connected to a third scan line GIi, a first electrode connected to the first node N1, and a second electrode receiving a first initialization voltage VINT. The fourth transistor T4 may be a gate initialization transistor. The fourth transistor T4 may be an N-type transistor.

A fifth transistor T5 may have a gate electrode connected to an emission line EMi, a first electrode receiving a first power source voltage ELVDD, and a second electrode connected to the second node N2. The fifth transistor T5 may be a first emission control transistor. The fifth transistor T5 may be a P-type transistor.

A sixth transistor T6 may have a gate electrode connected to the emission line EMi, a first electrode connected to the third node N3, and a second electrode connected to a fourth node N4. The sixth transistor T6 may be a second emission control transistor. The sixth transistor T6 may be a P-type transistor.

A seventh transistor T7 may have a gate electrode connected to a second scan line GBi, a first electrode receiving a second initialization voltage VAINT, and a second electrode connected to the fourth node N4. The seventh transistor T7 may be an anode initialization transistor. The seventh transistor T7 may be a P-type transistor.

An eighth transistor T8 may have a gate electrode connected to the second scan line GBi, a first electrode receiving a bias voltage VOBS, and a second electrode connected to the second node N2. The eighth transistor T8 may be a P-type transistor.

The storage capacitor Cst may have a first electrode receiving the first power source voltage ELVDD, and a second electrode connected to the first node N1.

The hold capacitor Chold may have a first electrode receiving the first power source voltage ELVDD, and a second electrode connected to the second node N2.

The light emitting element LD may have an anode connected to the fourth node N4, and a cathode receiving a second power source voltage ELVSS. The light emitting element LD may emit light of one of the first color, the second color, and the third color. The light emitting element LD may be a light emitting diode. The light emitting element LD may be composed of an organic light emitting diode, an inorganic light emitting diode, a quantum dot/well light emitting diode, or the like. In the present embodiment, each pixel is provided with a single light emitting element LD. However, in another embodiment, each pixel may be provided with light emitting elements. The light emitting elements may be connected in series, in parallel, or in series and parallel.

Figure 3:
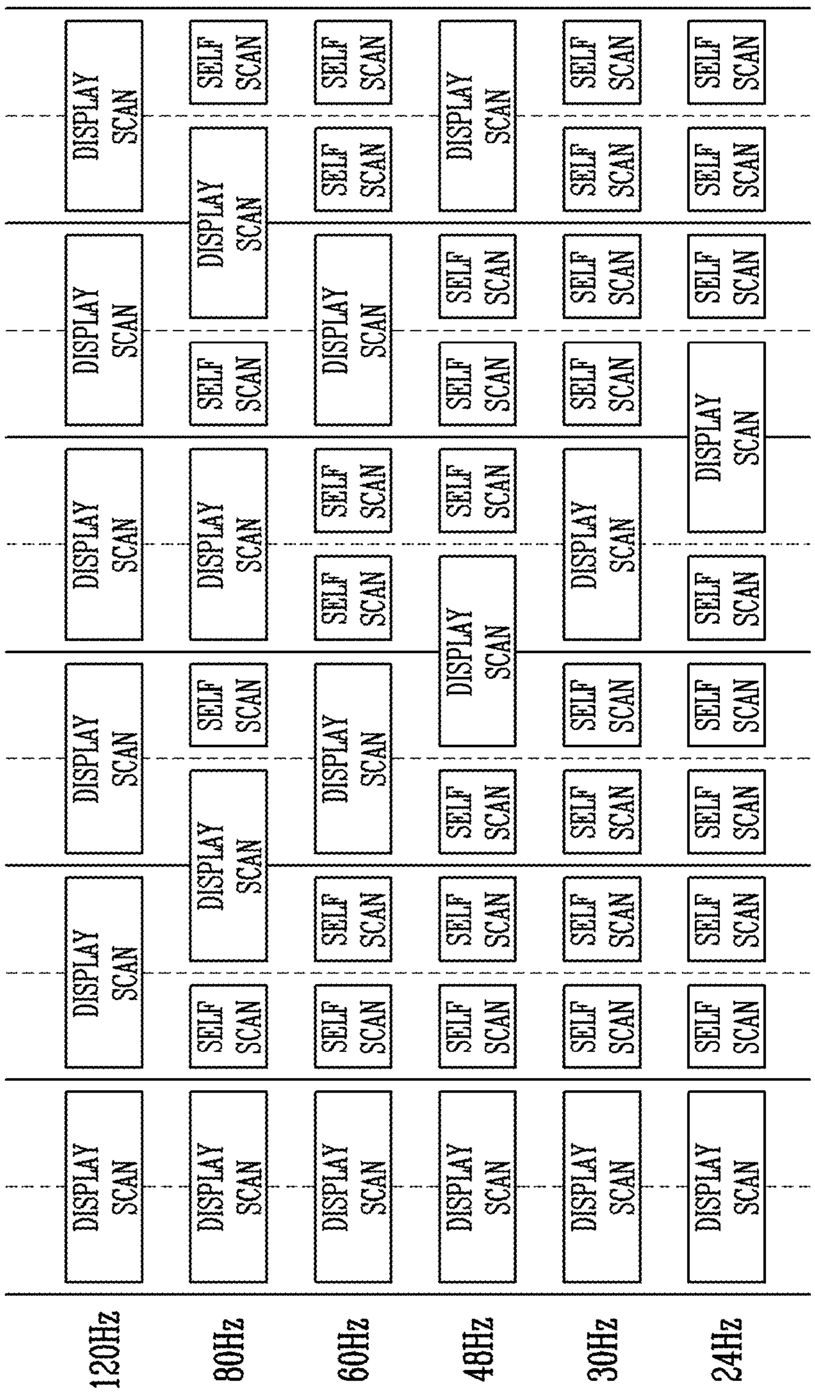
FIG. 3 is a schematic diagram for explaining a method of changing a display frequency according to an embodiment.

FIG. 3 is a schematic diagram for explaining a method of changing a display frequency according to an embodiment.

Referring to FIG. 3, the display device 10 may change the display frequency using first scan periods DISPLAY SCAN and second scan periods SELF SCAN.

A first scan period DISPLAY SCAN may be a period in which the pixels of the pixel unit 14 receive the data voltages. Accordingly, in case that a new first scan period DISPLAY SCAN starts, an image frame displayed by the pixel unit 14 may be changed. Accordingly, a cycle of the first scan periods DISPLAY SCAN may be the same as the display frequency. For example, during the first scan period DISPLAY SCAN, the first to fourth scan drivers 13GW, 13GB, 13GI, and 13GC may transmit scan signals of a turn-on level. For example, during the first scan period DISPLAY SCAN, the emission driver 15 may transmit emission signals of a turn-off level to overlap first scan signals of a turn-on level (see FIG. 4).

A second scan period SELF SCAN may be a period in which the pixels of the pixel unit 14 do not receive the data voltages. For example, during the second scan periods SELF SCAN, the first scan driver 13GW, the third scan driver 13GI, and the fourth scan driver 13GC may maintain scan signals of a turn-off level. During the second scan period SELF SCAN, the second scan driver 13GB may transmit second scan signals of a turn-on level, and the emission driver 15 may transmit the emission signals of the turn-off level (see FIG. 5).

FIG. 3 shows an example where one first scan period DISPLAY SCAN is approximately 1/120 second. If the first scan period DISPLAY SCAN is repeated without the second scan period SELF SCAN, the display device 10 may display an image at the display frequency of about 120 Hz. As the number of second scan periods SELF SCAN located between adjacent first scan periods DISPLAY SCAN increases, the display frequency may decrease.

FIG. 4 is a schematic diagram for explaining a first scan period according to an embodiment. FIG. 4 will be described with reference to the pixel PXij of FIG. 2.

At a time point t1*a*, in case that an emission signal of a turn-off level (high level) is applied to the emission line EMi, the fifth transistor T5 and the sixth transistor T6 may be turned off and the pixel PXij may be in a non-light emitting state.

At a time point t2*a*, in case that a third scan signal of a turn-on level (high level) is applied to the third scan line GIi, the fourth transistor T4 may be turned on. Accordingly, the first initialization voltage VINT may be applied to the first node N1. The first initialization voltage VINT may be a sufficiently low voltage that can on-bias the first transistor T1.

At a time point t3*a*, in case that a fourth scan signal of a turn-on level (high level) is applied to the fourth scan line GCi, the third transistor T3 may be turned on. Accordingly, the first transistor T1 may be in a diode-connected state in which a drain electrode and a gate electrode are connected.

At a time point t4*a*, in case that a scan signal of a turn-on level (low level) is applied to the first scan line GWi, the second transistor T2 may be turned on. Accordingly, a data voltage of the data line DLj may be applied to the first node N1 through the second transistor T2, the first transistor T1, and the third transistor T3 that are turned on. A voltage of the first node N1 may be a compensation voltage obtained by subtracting a threshold voltage of the first transistor T1 from the data voltage. The storage capacitor Cst may maintain a voltage difference between the first power source voltage ELVDD and the compensation voltage.

At a time point t5*a*, in case that the scan signal of the turn-on level (low level) is applied to the second scan line GBi, the seventh transistor T7 and the eighth transistor T8 may be turned on. As the seventh transistor T7 is turned on, the second initialization voltage VAINT may be applied to the anode of the light emitting element LD, and the light emitting element LD may be initialized with the amount of charge corresponding to a voltage difference between the second initialization voltage VAINT and the second power source voltage ELVSS. Accordingly, low grayscale expression can be facilitated in the light emitting element LD.

As the eighth transistor T8 is turned on, a voltage of the second node N2 may be set as the bias voltage VOBS. Accordingly, the bias voltage VOBS, rather than the data voltage of a previous frame period, may be applied to a source electrode of the first transistor T1. Therefore, the hysteresis phenomenon can be prevented, and the on-bias state can be guaranteed.

At a time point t6*a*, in case that an emission signal of a turn-on level (low level) is applied to the emission line EMi, the fifth transistor T5 and the sixth transistor T6 may be turned on. Accordingly, a path for a driving current flowing from the first power source voltage ELVDD to the second power source voltage ELVSS via the fifth transistor T5, the first transistor T1, the sixth transistor T6, and the light emitting element LD may be formed.

The amount of driving current may be adjusted depending on a voltage maintained in the storage capacitor Cst. The light emitting element LD may emit light with a luminance corresponding to the amount of driving current. The light emitting element LD may emit light until the emission signal of the turn-off level is applied to the emission line EMi.

Figure 5:
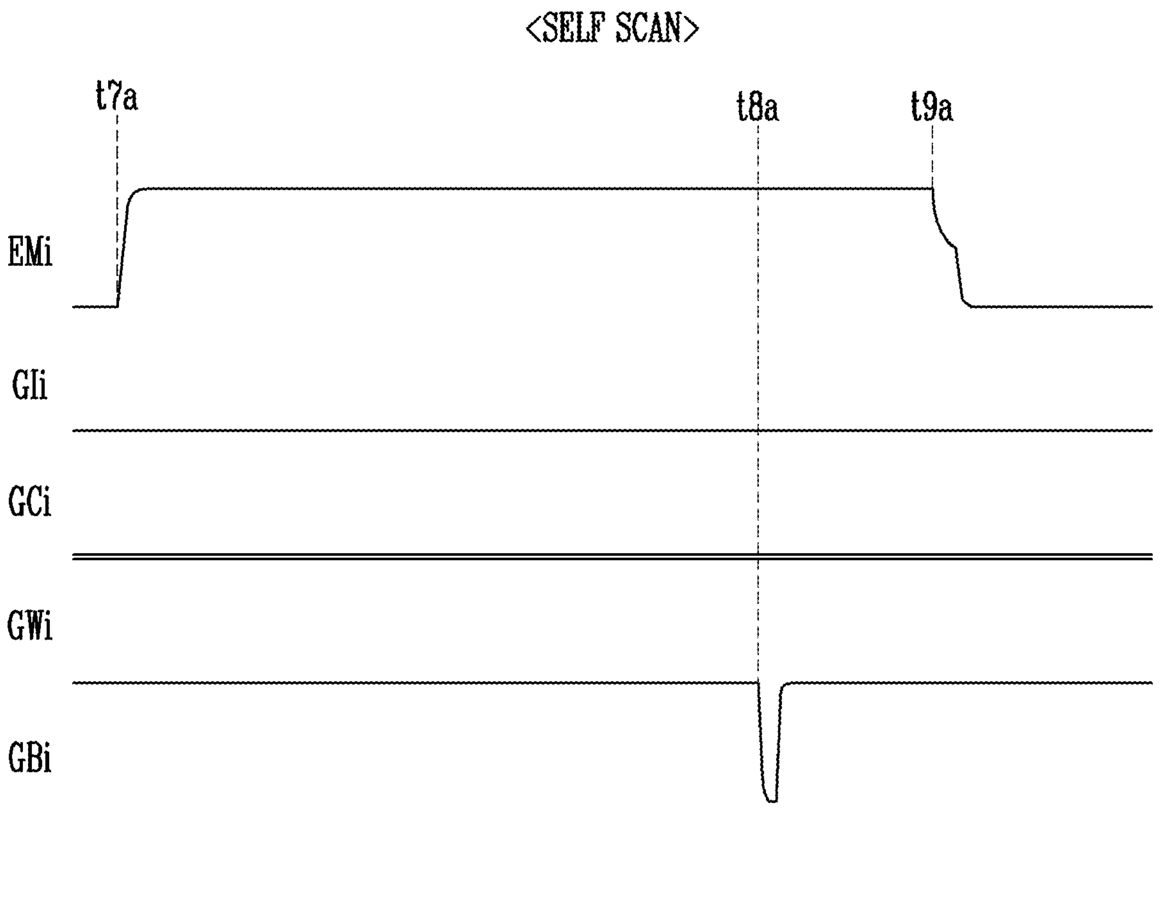
FIG. 5 is a schematic diagram for explaining a second scan period according to an embodiment.

FIG. 5 is a schematic diagram for explaining a second scan period according to an embodiment. FIG. 5 will be described with reference to the pixel PXij of FIG. 2.

At a time point t7*a*, in case that the emission signal of the turn-off level (high level) is applied to the emission line EMi, the fifth transistor T5 and the sixth transistor T6 may be turned off and the pixel PXij may be in a non-light emitting state.

During a period t7*a* to t8*a*, scan signals of a turn-off level may be maintained in the first scan line GWi, the third scan line GIi, and the fourth scan line GCi. Accordingly, the voltage of the first node N1 may not be changed.

At a time point t8*a*, in case that the scan signal of the turn-on level (low level) is applied to the second scan line GBi, the seventh transistor T7 and the eighth transistor T8 may be turned on. As the seventh transistor T7 is turned on, the second initialization voltage VAINT may be applied to the anode of the light emitting element LD, and the light emitting element LD may be initialized with the amount of charge corresponding to a voltage difference between the second initialization voltage VAINT and the second power source voltage ELVSS. Accordingly, low grayscale expression can be facilitated in the light emitting element LD.

As the eighth transistor T8 is turned on, the voltage of the second node N2 may be set as the bias voltage VOBS. Accordingly, the bias voltage VOBS, rather than the data voltage of a previous frame period, may be applied to the source electrode of the first transistor T1. Therefore, the hysteresis phenomenon can be prevented, and the on-bias state can be guaranteed.

At a time point t9*a*, in case that the emission signal of the turn-on level (low level) is applied to the emission line EMi, the fifth transistor T5 and the sixth transistor T6 may be turned on. Accordingly, a path for a driving current flowing from the first power source voltage ELVDD to the second power source voltage ELVSS via the fifth transistor T5, the first transistor T1, the sixth transistor T6, and the light emitting element LD may be formed.

The amount of driving current may be adjusted depending on a voltage maintained in the storage capacitor Cst. The voltage of the first node N1 recorded during the first scan period DISPLAY SCAN may be maintained during the second scan period SELF SCAN. Therefore, an image frame displayed by the pixel unit 14 during the second scan period SELF SCAN may be the same as an image frame displayed by the pixel unit 14 during the first scan period DISPLAY SCAN.

Figure 6:
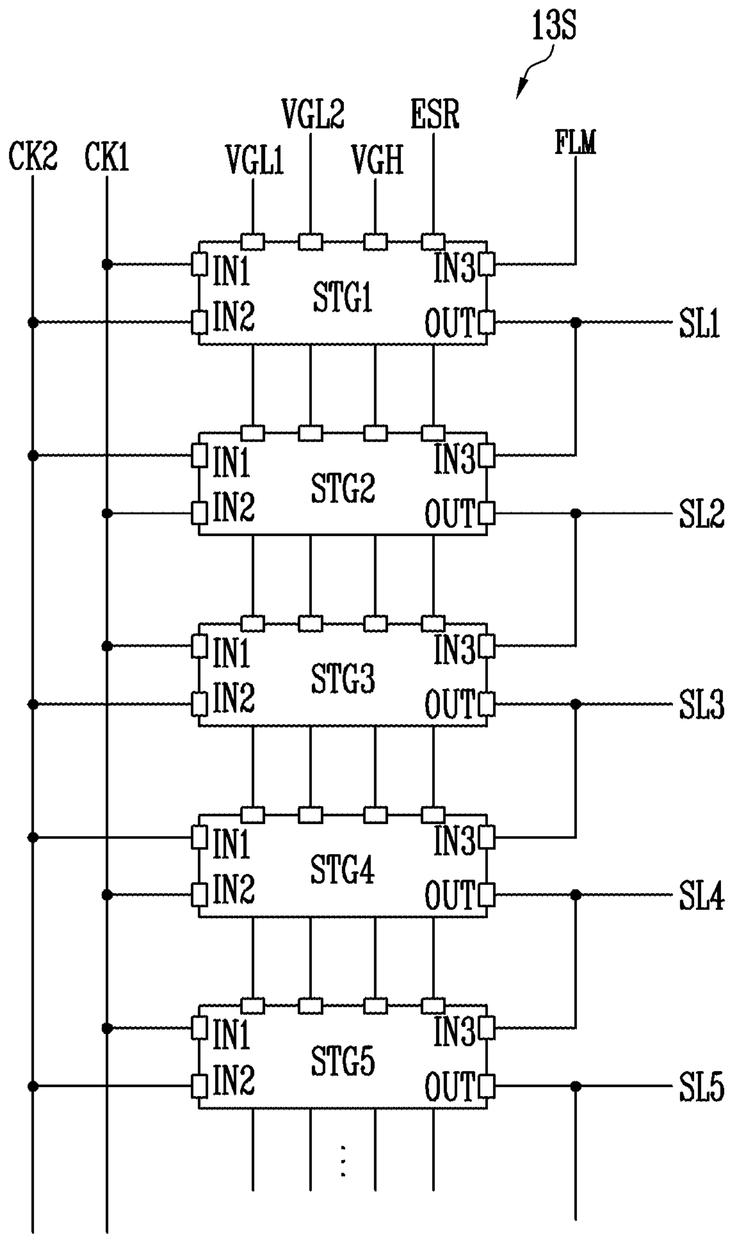
FIG. 6 is a schematic diagram for explaining a scan driver according to an embodiment.

FIG. 6 is a schematic diagram for explaining a scan driver according to an embodiment.

Referring to FIG. 6, a scan driver 13S according to an embodiment may include stages STG1, STG2, STG3, STG4, STG5, . . . .

For example, the scan driver 13S may be the third scan driver 13GI or the fourth scan driver 13GC. Hereinafter, the scan driver 13S will be described, but the emission driver 15 may also have the same structure. Referring to FIG. 4, it can be seen that waveforms of pulses applied to the third scan line GIi, the fourth scan line GCi, and the emission line EMi are similar to each other. The length of the pulses can be adjusted by the length of a pulse of a scan start signal FLM. For example, all of the following embodiments can be equally applied to the emission driver 15.

Figure 8:
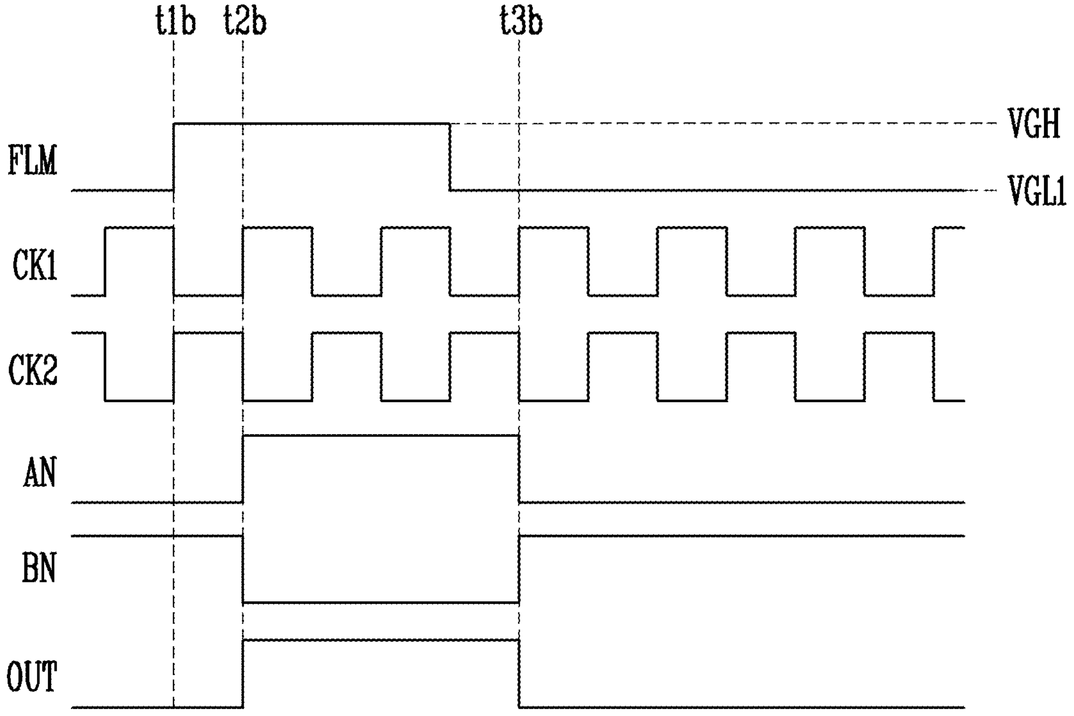
FIG. 8 is a schematic diagram for explaining an example of a method of driving the stage of FIG. 7.

If a voltage level of the scan start signal FLM of FIG. 8 is inverted, a voltage level of the scan signal at an output terminal OUT may also be inverted. Accordingly, the scan driver 13S may function as the first scan driver 13GW or the second scan driver 13GB.

Each of the stages STG1, STG2, STG3, STG4, STG5, . . . may include a first input terminal IN1, a second input terminal IN2, a third input terminal IN3, an output terminal OUT, and voltage input terminals. The stages STG1, STG2, STG3, STG4, STG5, . . . may commonly receive a first low voltage VGL1, a second low voltage VGL2, a high voltage VGH, and a reset signal ESR.

In odd-numbered stages STG1, STG3, STG5, . . . , first input terminals IN1 may receive a first clock signal CK1, and second input terminals IN2 may receive a second clock signal CK2.

In even-numbered stages STG2, STG4, . . . , first input terminals IN1 may receive the second clock signal CK2, and second input terminals IN2 may receive the first clock signal CK1.

Output terminals OUT of the stages STG1 to STG5, . . . may be connected to corresponding scan lines SL1, SL2, SL3, SL4, SL5, . . . . The stages STG1 to STG5, . . . may sequentially supply scan signals of a turn-on level to the scan lines SL1 to SL5, . . . .

Third input terminals IN3 of the stages STG2 to STG5, . . . may be connected to the output terminal OUT of a previous stage. However, the third input terminal IN3 of a first stage STG1 may receive the scan start signal FLM.

Figure 7:
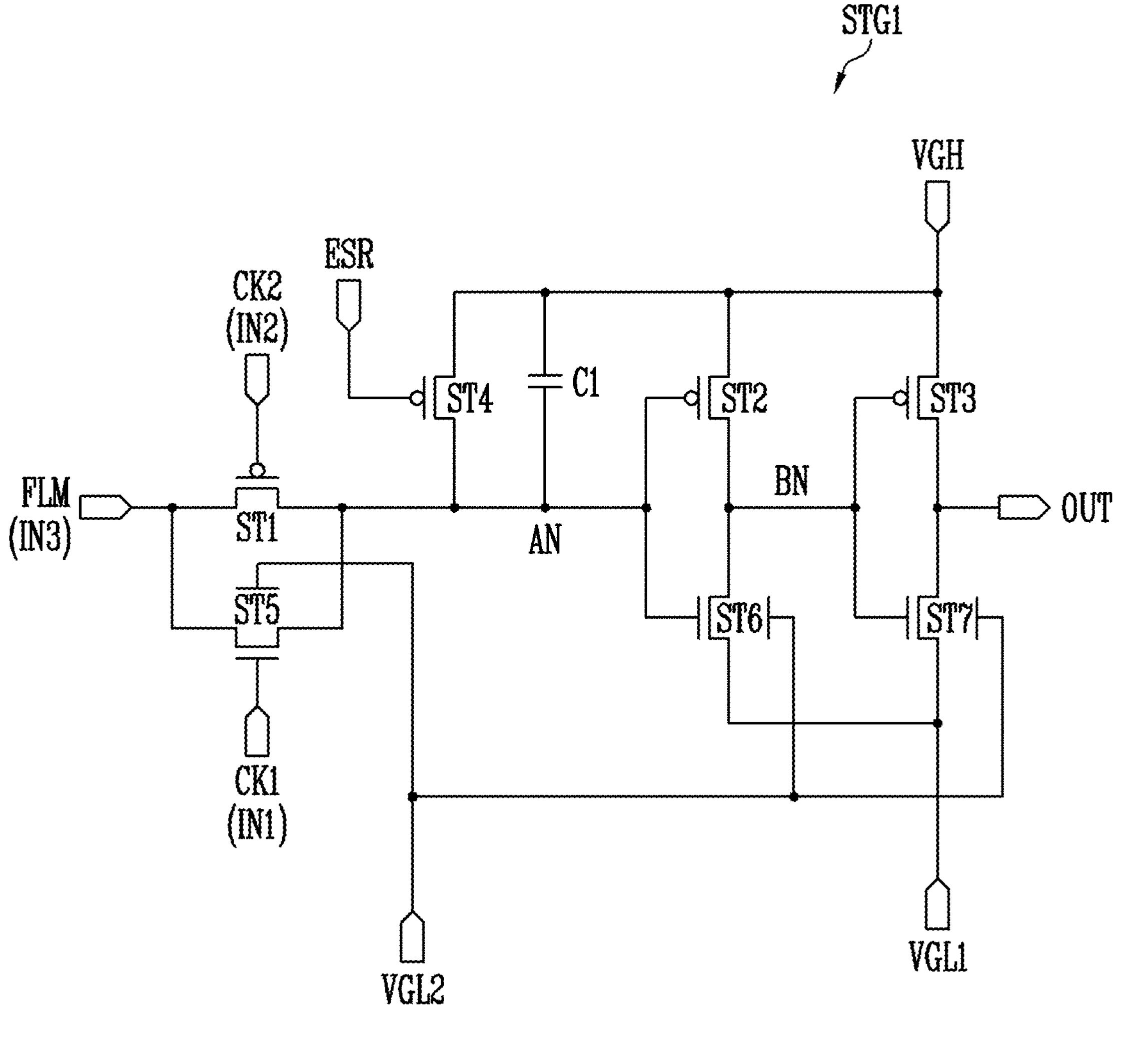
FIG. 7 is a schematic diagram for explaining a stage according to an embodiment.

FIG. 7 is a schematic diagram for explaining a stage according to an embodiment.

Referring to FIG. 7, a stage STG1 according to an embodiment may include transistors ST1, ST2, ST3, ST4, ST5, ST6, and ST7 and a capacitor C1.

The transistors ST1, ST2, ST3, and ST4 may be P-type transistors. The transistors ST1, ST2, ST3, and ST4 may be polysilicon semiconductor transistors. The transistors ST5, ST6, and ST7 may be N-type transistors. The transistors ST5, ST6, and ST7 may be oxide semiconductor transistors.

A gate electrode of a first transistor ST1 may be connected to the second input terminal IN2 to receive the second clock signal CK2. A first electrode of the first transistor ST1 may be connected to the third input terminal IN3 to receive the scan start signal FLM. A second electrode of the first transistor ST1 may be connected to a node AN.

A second transistor ST2 may have a gate electrode connected to the node AN, a first electrode receiving the high voltage VGH, and a second electrode connected to a node BN.

A third transistor ST3 may have a gate electrode connected to the node BN, a first electrode receiving the high voltage VGH, and a second electrode connected to the output terminal OUT.

A fourth transistor ST4 may have a gate electrode receiving the reset signal ESR, a first electrode receiving the high voltage VGH, and a second electrode connected to the node AN. The fourth transistor ST4 may be turned on in case needed to reset the node AN to the high voltage VGH.

A gate electrode of a fifth transistor ST5 may be connected to the first input terminal IN1 to receive the first clock signal CK1. A first electrode of the fifth transistor ST5 may be connected to the node AN, and a second electrode of the fifth transistor ST5 may be connected to the third input terminal IN3 to receive the scan start signal FLM.

A sixth transistor ST6 may have a gate electrode connected to the node AN, a first electrode connected to the node BN, and a second electrode receiving the first low voltage VGL1.

A seventh transistor ST7 may have a gate electrode connected to the node BN, a first electrode connected to the output terminal OUT, and a second electrode receiving the first low voltage VGL1.

Back gate electrodes of the fifth, sixth, and seventh transistors ST5, ST6, and ST7 may receive the second low voltage VGL2. A voltage level of the second low voltage VGL2 may be lower than a voltage level of the first low voltage VGL1. This may be to adjust threshold voltages of the fifth, sixth, and seventh transistors ST5, ST6, and ST7, and may vary depending on embodiments. For example, a back gate electrode of each of the fifth, sixth, and seventh transistors ST5, ST6, and ST7 may be connected to its own gate electrode. The supply of the second low voltage VGL2 may be omitted.

The capacitor C1 may have a first electrode receiving the high voltage VGH, and a second electrode connected to the node AN. According to an embodiment, in case that parasitic capacitances of the second and sixth transistors ST2 and ST6 are sufficiently large, the capacitor C1 may be omitted.

FIG. 8 is a schematic diagram for explaining an example of a method of driving the stage of FIG. 7.

In an embodiment, a phase of the second clock signal CK2 may be different from a phase of the first clock signal CK1. For example, the phase of the second clock signal CK2 may have a difference of about 180 degrees from the phase of the first clock signal CK1. In another embodiment, the second clock signal CK2 may be an inverted signal of the first clock signal CK1.

At a time point t1*b*, a scan start signal FLM of a turn-on level (high level) may be supplied. The fifth transistor ST5 may be turned off by the first clock signal CK1 of a low level, and the first transistor ST1 may be turned off by the second clock signal CK2 of a high level. Accordingly, a voltage level of the node AN may be maintained at a low level.

At a time point t2*b*, the fifth transistor ST5 may be turned on by the first clock signal CK1 of a high level, and the first transistor ST1 may be turned on by the second clock signal CK2 of a low level. Accordingly, the scan start signal FLM of the turn-on level may be applied to the node AN, and the voltage level of the node AN may rise to a high level.

As the voltage level of the node AN becomes the high level, the sixth transistor ST6 may be turned on. Accordingly, the first low voltage VGL1 may be applied to the node BN. Therefore, the voltage level of the node BN may fall to a low level.

As the voltage level of the node BN becomes the low level, the third transistor ST3 may be turned on. Accordingly, the high voltage VGH may be applied to the output terminal OUT, and a scan signal of a turn-on level (high level) may be output through the output terminal OUT.

At a time point t3*b*, the fifth transistor ST5 may be turned on by the first clock signal CK1 of the high level, and the first transistor ST1 may be turned on by the second clock signal CK2 of the low level. Accordingly, a scan start signal FLM of a turn-off level (low level) may be applied to the node AN, and the voltage level of the node AN may fall to the low level.

As the voltage level of the node AN becomes the low level, the second transistor ST2 may be turned on. Accordingly, the high voltage VGH may be applied to node BN. Therefore, the voltage level of the node BN may rise to the high level.

As the voltage level of the node BN becomes the high level, the seventh transistor ST7 may be turned on. Accordingly, the first low voltage VGL1 may be applied to the output terminal OUT, and a scan signal of a turn-off level (low level) may be output through the output terminal OUT.

Figure 9:
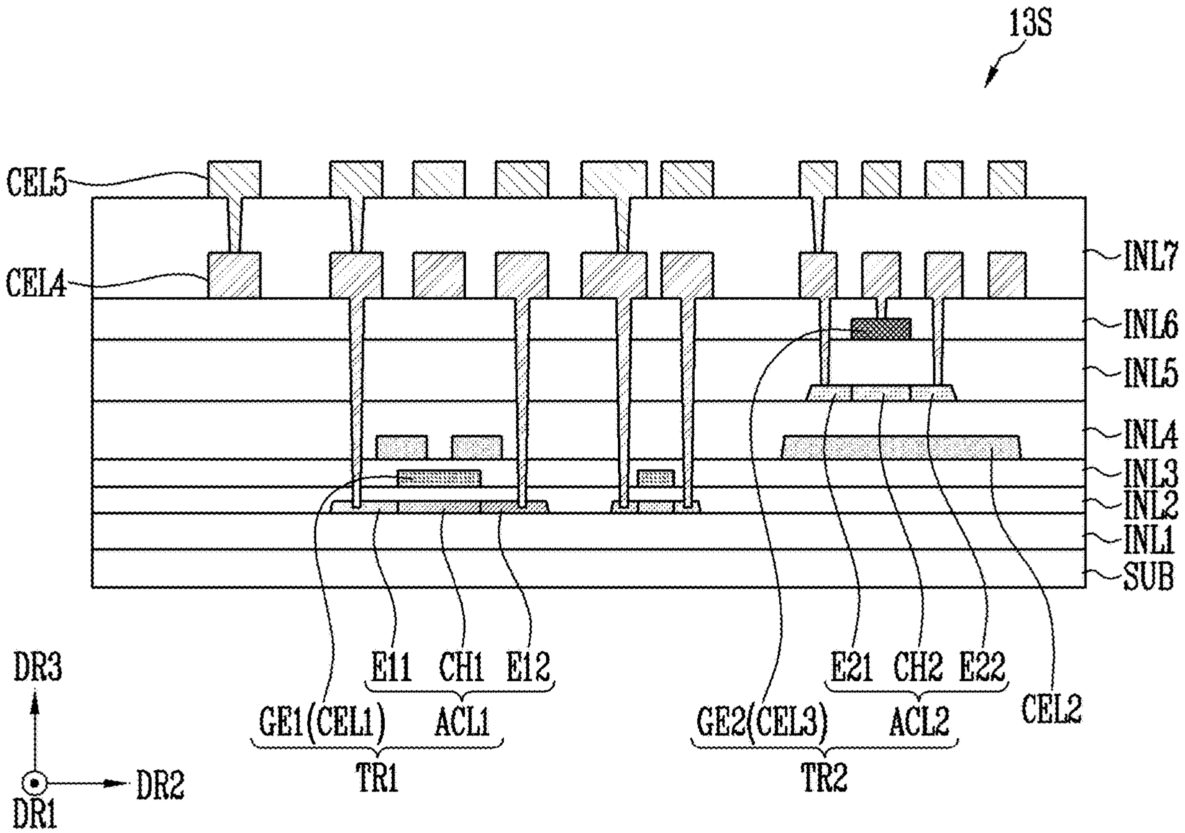
FIG. 9 is a schematic diagram for explaining a stacked structure of the scan driver according to an embodiment.

FIG. 9 is a schematic diagram for explaining a stacked structure of the scan driver according to an embodiment.

A first direction DR1, a second direction DR2, and a third direction DR3 may be perpendicular to each other. The first direction DR1 and the second direction DR2 may indicate a planar direction, and the third direction DR3 may indicate a height direction.

Referring to FIG. 9, the scan driver 13S may have a structure in which a substrate SUB, a first insulating layer INL1, a first active layer ACL1, a second insulating layer INL2, a first electrode layer CEL1, a third insulating layer INL3, a second electrode layer CEL2, a fourth insulating layer INL4, a second active layer ACL2, a fifth insulating layer INL5, a third electrode layer CEL3, a sixth insulating layer INL6, a fourth electrode layer CEL4, a seventh insulating layer INL7, and a fifth electrode layer CEL5 are sequentially stacked.

The stacked structure of FIG. 9 may be equally applied to the pixel unit 14. For example, the pixel unit 14 and the scan driver 13S may be manufactured simultaneously on one substrate SUB. For example, the pixel unit 14 and the scan driver 13S may share electrode layers and insulating layers. For example, the P-type transistors T1, T2, T5, T6, T7, and T8 of the pixel circuit PXC of FIG. 2 may be composed of polysilicon semiconductor transistors TR1. Also, the N-type transistors T3 and T4 of the pixel circuit PXC of FIG. 2 may be composed of oxide semiconductor transistors TR2. For example, the P-type transistors ST1, ST2, ST3, and ST4 of the stage STG1 of FIG. 7 may be composed of polysilicon semiconductor transistors TR1. Also, the N-type transistors ST5, ST6, and ST7 of the stage STG1 of FIG. 7 may be composed of oxide semiconductor transistors TR2.

The substrate SUB may be made of various materials such as glass, polymer, metal, or the like. The substrate SUB may be one selected from a rigid substrate and a flexible substrate depending on a product to be applied. In case that the substrate SUB includes a polymer organic material, the substrate SUB may be made of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, or the like. On the other hand, the substrate SUB may be made of glass, fiber glass reinforced plastic (FRP), or the like.

The first active layer ACL1 and the second active layer ACL2 may be semiconductor layers. For example, the first active layer ACL1 may be made of a polysilicon semiconductor, and the second active layer ACL2 may be made of an oxide semiconductor. The first active layer ACL1 may include a channel CH1, a first electrode E11, and a second electrode E12 of a polysilicon semiconductor transistor TR1 (transistors ST1, ST2, ST3, or ST4 of FIG. 7). The second active layer ACL2 may include a channel CH2, a first electrode E21, and a second electrode E22 of an oxide semiconductor transistor TR2 (transistors ST5, ST6, or ST7 of FIG. 7). The first and second electrodes of each transistor may be doped with impurities to have conductivity.

A gate electrode GE1 of the polysilicon semiconductor transistor TR1 may be located in the first electrode layer CELL. According to an embodiment, a sub-gate electrode (back gate electrode, or body electrode) of the polysilicon semiconductor transistor TR1 may be located between the substrate SUB and the first insulating layer INL1.

A gate electrode GE2 of the oxide semiconductor transistor TR2 may be located in the third electrode layer CEL3. According to an embodiment, a sub-gate electrode (back gate electrode or body electrode) of the oxide semiconductor transistor TR2 may be located in the second electrode layer CEL2.

The first electrode layer CEL1, the second electrode layer CEL2, the third electrode layer CEL3, the fourth electrode layer CEL4, and the fifth electrode layer CEL5 may be conductive layers. Each electrode layer may be composed of a single layer or multiple layers, and may include known conductors such as gold (Au), silver (Ag), aluminum (Al), molybdenum (Mo), chromium (Cr), titanium (Ti), nickel (Ni), neodymium (Nd), copper (Cu), and platinum (Pt).

The first insulating layer INL1, the second insulating layer INL2, the third insulating layer INL3, the fourth insulating layer INL4, the fifth insulating layer INL5, the sixth insulating layer INL6, and the seventh insulating layer INL7 may be interposed to electrically separate the active layers ACL1 and ACL2 and the first to fifth electrode layers CEL1, CEL2, CEL3, CEL4, and CEL5. Necessary electrode patterns may be connected to each other through a contact hole formed in each of the insulating layers INL1 to INL7. The insulating layers INL1 to INL7 may be made of an organic insulating film, an inorganic insulating film, or an organic/inorganic insulating film, and may be composed of a single layer or multiple layers. For example, the insulating layers INL1 to INL7 may include at least one of silicon nitride (SiNx), silicon oxide (SiOx), silicon oxynitride (SiOxNy), an acryl resin, an epoxy resin, a phenolic resin, a polyamide resin, and a polyimide resin.

FIGS. 10 to 17 are schematic diagrams for explaining a plan layout of the stage according to an embodiment.

Figure 10:
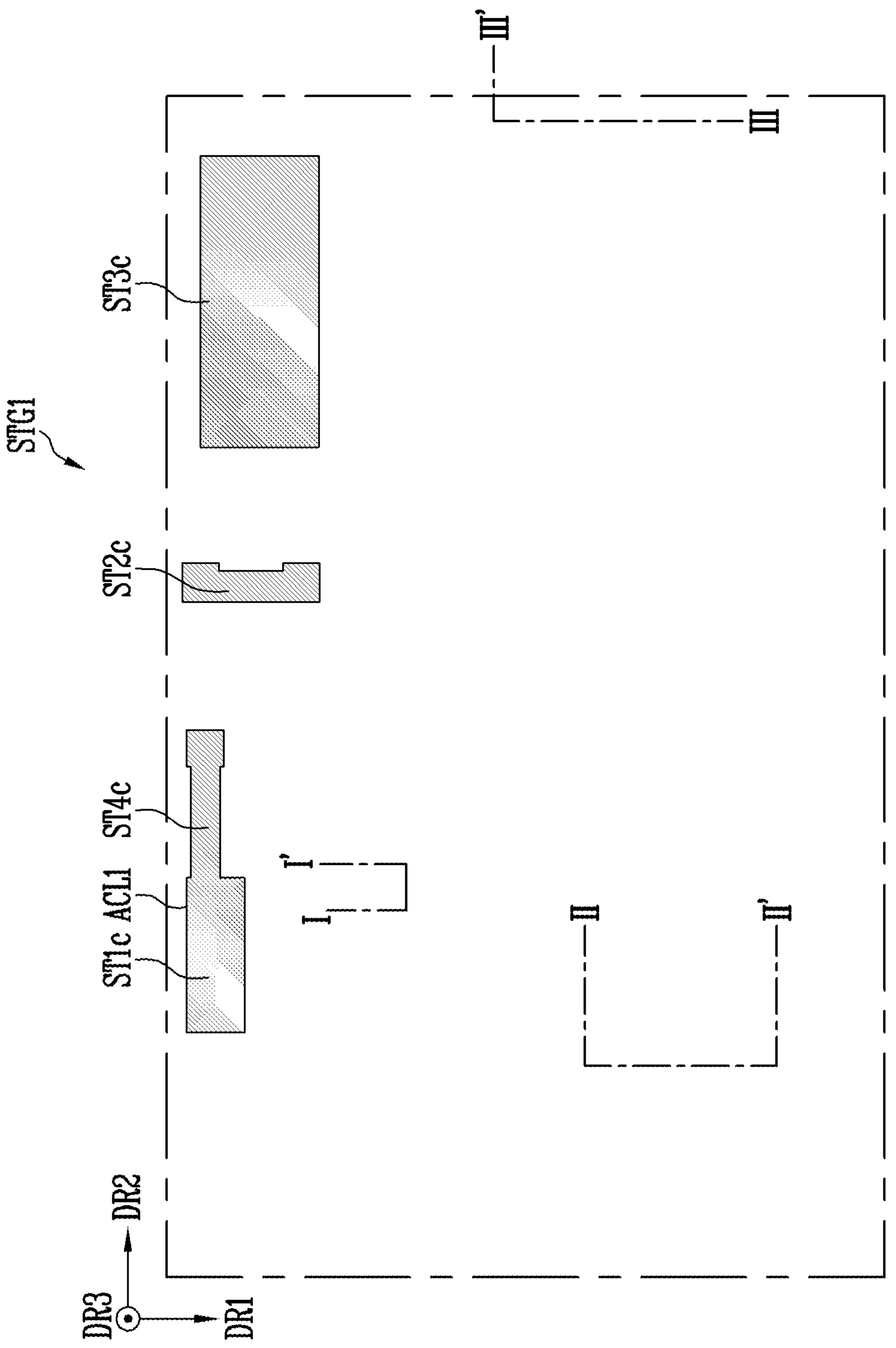
FIGS. 10 to 17 are schematic diagrams for explaining a plan layout of the stage according to an embodiment.

Referring to FIG. 10, the first active layer ACL1 may include channels ST1*c*, ST2*c*, ST3*c*, and ST4*c* of the transistors ST1, ST2, ST3, and ST4. Portions of the first active layer ACL1 spaced apart from each other with a channel interposed therebetween may constitute the first and second electrodes of the transistors ST1, ST2, ST3, and ST4.

Figure 11:
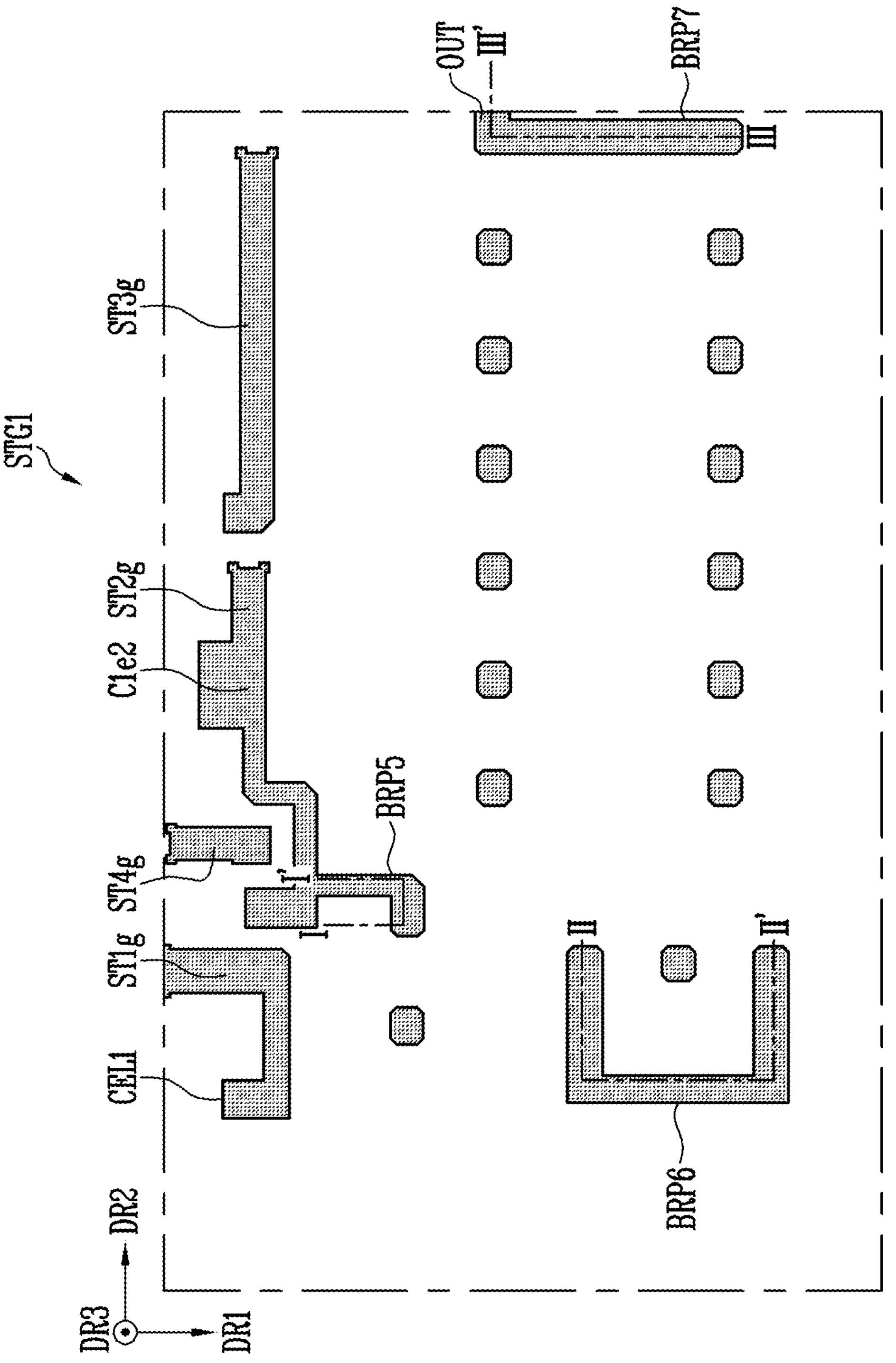

Referring to FIG. 11, an example of patterns of the first electrode layer CEL1 is shown. The first electrode layer CEL1 may include gate electrodes ST1*g*, ST2*g*, ST3*g*, and ST4*g* of the transistors ST1, ST2, ST3, and ST4. The gate electrodes ST1*g*, ST2*g*, ST3*g*, and ST4*g* may overlap the corresponding channels ST1*c*, ST2*c*, ST3*c*, and ST4*c* in the third direction DR3.

Some patterns of the first electrode layer CEL1 may constitute bridge patterns BRP5, BRP6, and BRP7 and a second electrode C1*e*2 of the capacitor C1. For example, a bridge pattern BRP7 may correspond to the output terminal OUT.

Figure 12:
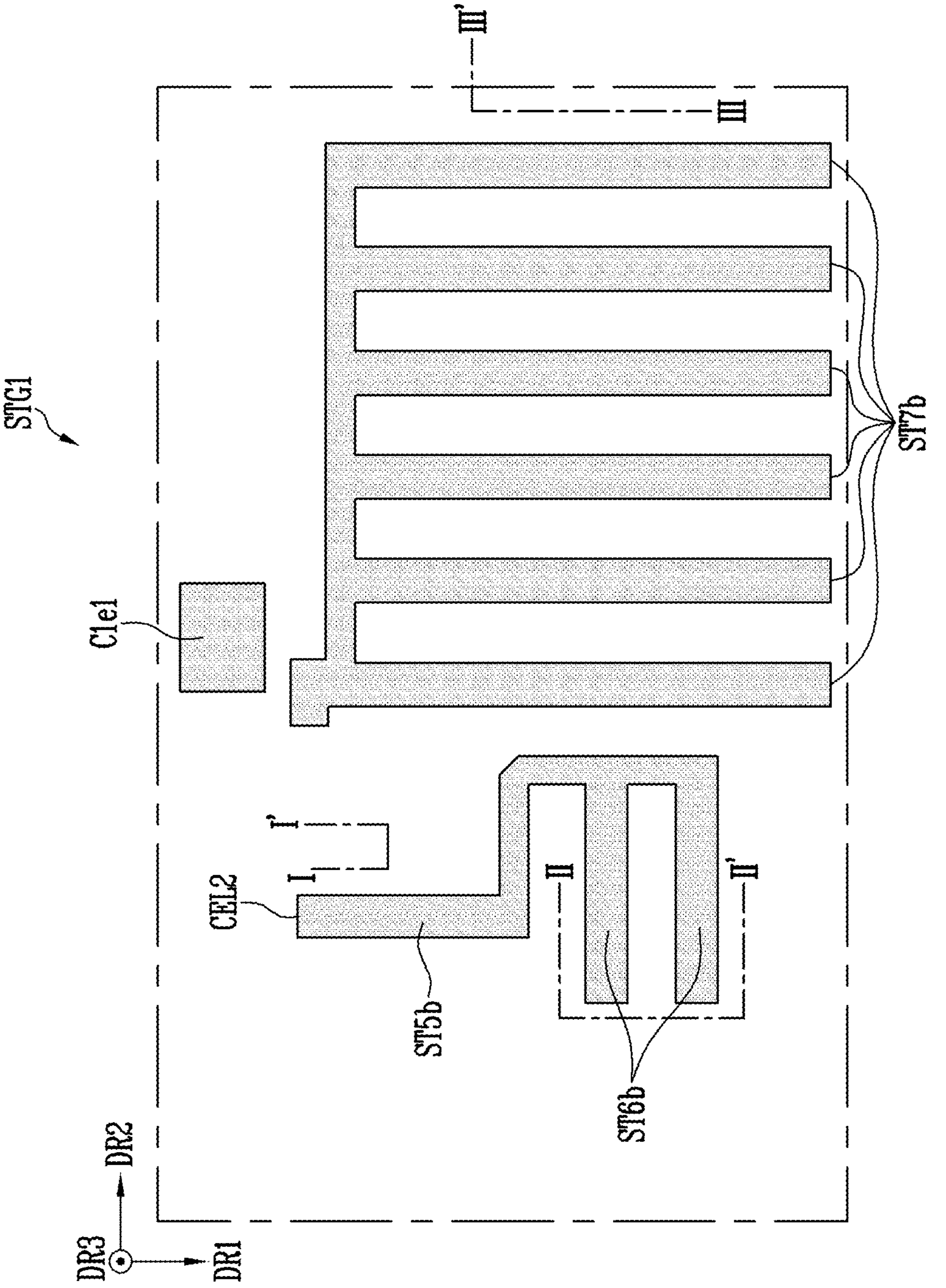

Referring to FIG. 12, an example of patterns of the second electrode layer CEL2 is shown. The second electrode layer CEL2 may include back gate electrodes ST5*b*, ST6*b*, and ST7*b* of the transistors ST5, ST6, and ST7. For example, one pattern of the second electrode layer CEL2 may constitute a first electrode C1*e*1 of the capacitor C1.

Figure 13:
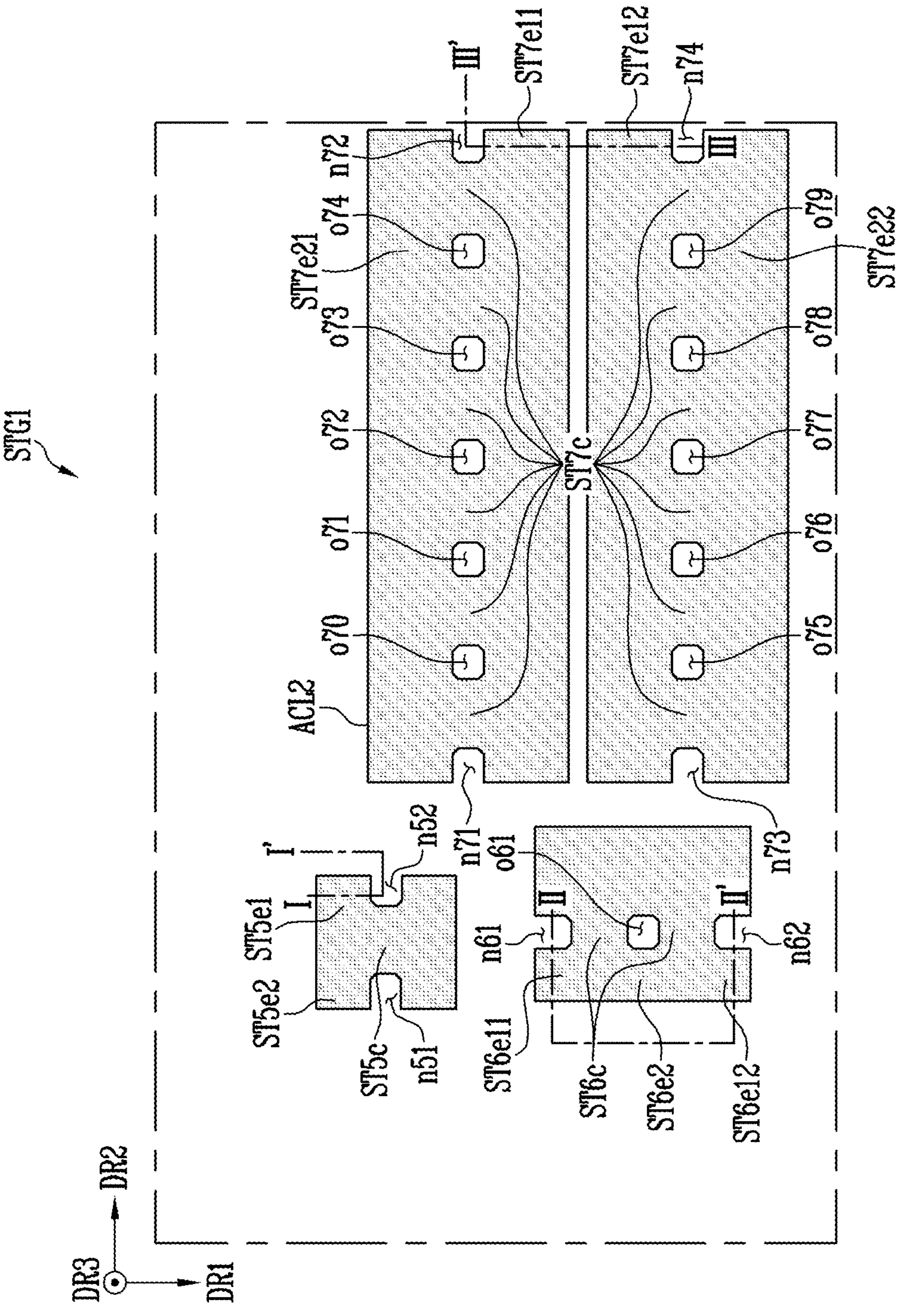

Referring to FIG. 13, an example of patterns of the second active layer ACL2 is shown. The second active layer ACL2 may include semiconductor patterns of the transistors ST5, ST6, and ST7. The semiconductor patterns of the transistors ST5, ST6, and ST7 may include channels ST5*c*, ST6*c*, and ST7*c*. The channels ST5*c*, ST6*c*, and ST7*c* may overlap the corresponding back gate electrodes ST5*b*, ST6*b*, and ST7*b* in the third direction DR3. Portions of the semiconductor pattern spaced apart from each other with a channel interposed therebetween may constitute the first and second electrodes of the transistors ST5, ST6, and ST7.

For example, a semiconductor pattern of the fifth transistor ST5 may include a channel ST5*c*, a first electrode ST5*e*1, and a second electrode ST5*e*2. The channel ST5*c* may extend in the first direction DR1. The first electrode ST5*e*1 may extend in the first direction DR1 and may include an etched portion n52. The second electrode ST5*e*2 may extend in the first direction DR1 and may include an etched portion n51.

For example, a semiconductor pattern of the sixth transistor ST6 may include two channels ST6*c*, two first sub-electrodes ST6*e*11 and ST6*e*12, and one second electrode ST6*e*2. The channels ST6*c* may extend in the second direction DR2. The first sub-electrode ST6*e*11 may extend in the second direction DR2 and may include an etched portion n61. The second electrode ST6*e*2 may extend in the second direction DR2 and may include an etched portion o61. The first sub-electrode ST6*e*12 may extend in the second direction DR2 and may include an etched portion n62.

For example, a semiconductor pattern of the seventh transistor ST7 may include the channels ST7*c*, first sub-electrodes ST7*e*11, ST7*e*12, . . . , and second sub-electrodes ST7*e*21, STe22, . . . . As shown in FIG. 13, twelve channels ST7*c*, eight first sub-electrodes ST7*e*11, ST7*e*12, . . . , and six second sub-electrodes ST7*e*21, STe22, . . . may be provided. The channels ST7*c*, the first sub-electrodes ST7*e*11, ST7*e*12, . . . , and the second sub-electrodes ST7*e*21, STe22, . . . may extend in the first direction DR1.

The first sub-electrodes ST7*e*11, ST7*e*12, . . . may include corresponding etched portions n72, n74, o73, o78, o71, o76, n71, and n73. The first sub-electrodes ST7*e*11, ST7*e*12, . . . and the etched portions n72, n74, o73, o78, o71, o76, n71, and n73 may overlap an electrode pattern EP71 in the third direction DR3 (see FIG. 15). The second sub-electrodes ST7*e*21, STe22, . . . may include corresponding etched portions o74, o79, o72, o77, o70, and o75. The second sub-electrodes ST7*e*21, STe22, . . . and the etched portions o74, o79, o72, o77, o70, and o75 may overlap an electrode pattern EP72 in the third direction DR3 (FIG. 15).

The etched portions n51 to n74 and o61 to o79 may be hydrogen exhaust ports. The conductivity of the semiconductor pattern may be determined as hydrogen escapes through the etched portion. For example, as the etched portions become larger and more numerous, the conductivity of adjacent semiconductor patterns may increase. The etched portions n51 to n74 and o61 to o79 may be notches n51 to n74 or openings o61 to o79.

Figure 14:
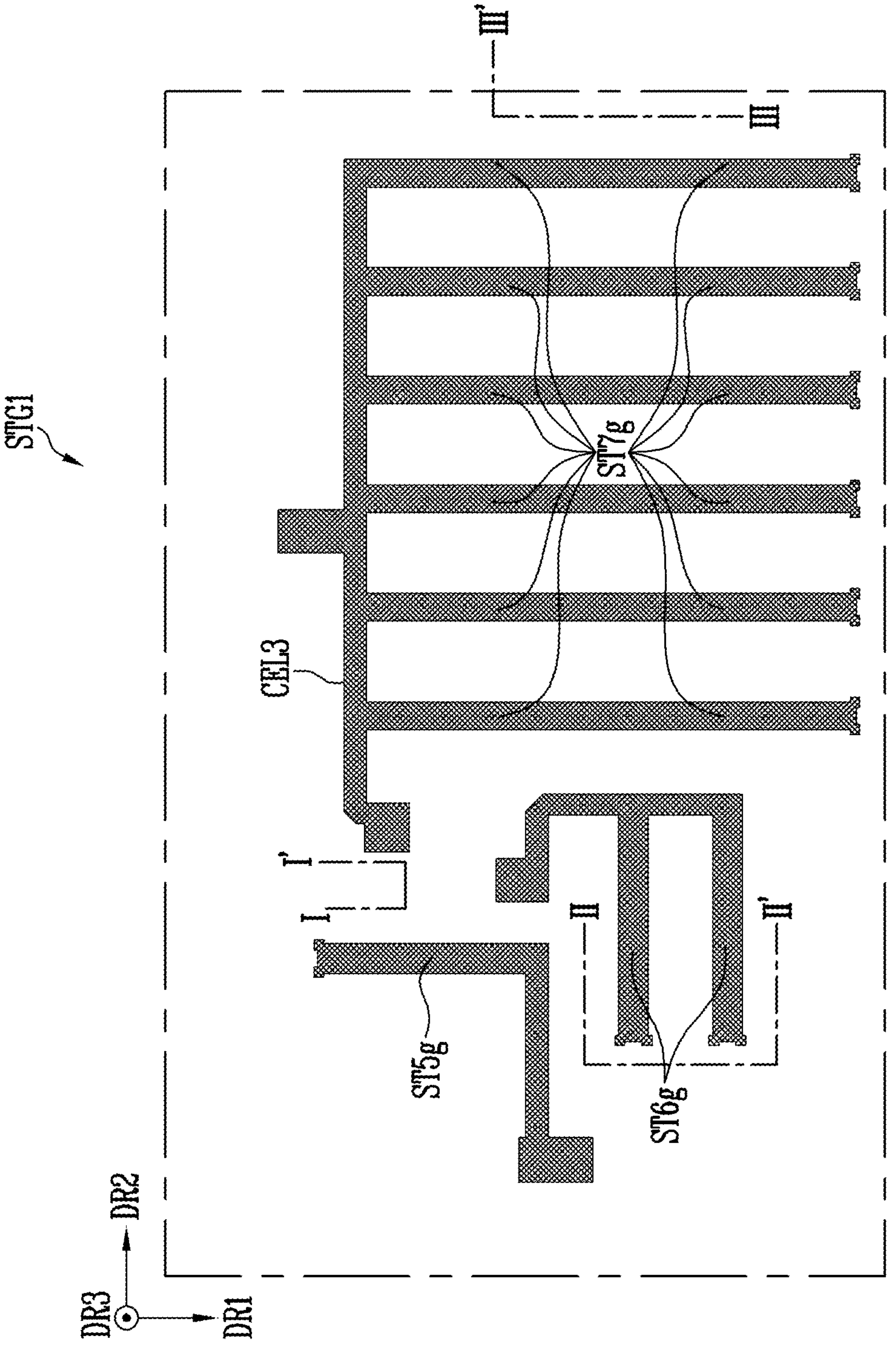

Referring to FIG. 14, an example of patterns of the third electrode layer CEL3 is shown. The third electrode layer CEL3 may include gate electrodes ST5*g*, ST6*g*, and ST7*g* of the transistors ST5, ST6, and ST7. The gate electrodes ST5*g*, ST6*g*, and ST7*g* may overlap the corresponding channels ST5*c*, ST6*c*, and ST7*c* in the third direction DR3.

Figure 15:
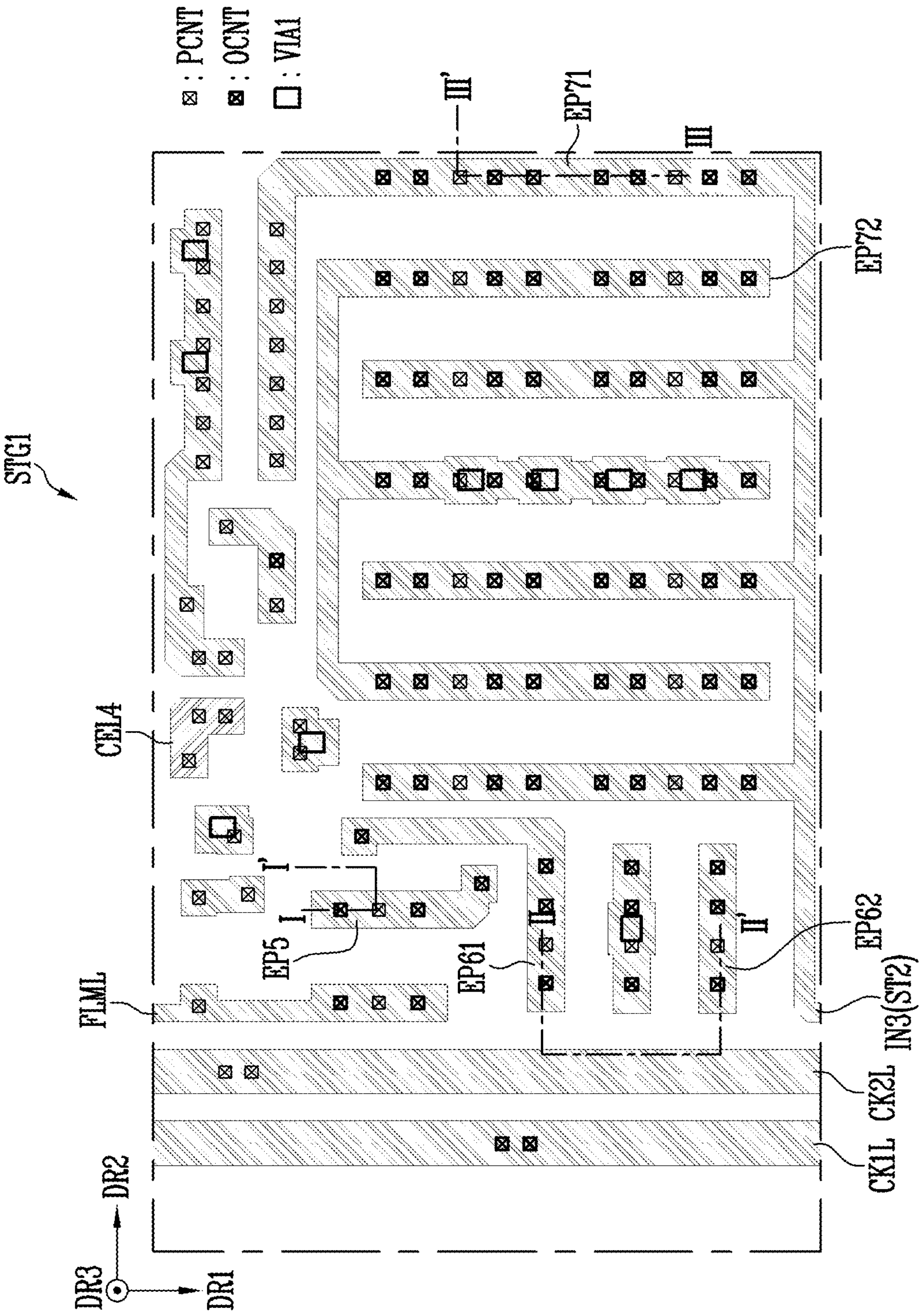

Referring to FIG. 15, an example of patterns of the fourth electrode layer CEL4 is shown. Some patterns of the fourth electrode layer CEL4 may include a first clock line CK1L, a second clock line CK2L, a scan start line FLML, and electrode patterns EP5, EP61, EP62, EP71, and EP72. However, in stages other than the first stage STG1, the output terminal OUT of a previous stage may be located at the position of the scan start line FLML. The electrode pattern EP71 may correspond to the third input terminal IN3 of the next stage STG2. The first clock signal CK1 may be applied to the first clock line CK1L, and the second clock signal CK2 may be applied to the second clock line CK2L.

First contact holes PCNT may be holes etched to connect the patterns of the fourth electrode layer CEL4 to the electrode layer or first active layer ACL1 located below. Second contact holes OCNT may be holes etched to connect the patterns of the fourth electrode layer CEL4 to the electrode layer or second active layer ACL2 located below.

Third contact holes VIA1 may be holes formed in the seventh insulating layer INL7 on the fourth electrode layer CEL4, and are shown to explain the relationship between the fourth electrode layer CEL4 and the fifth electrode layer CEL5.

Figure 16:
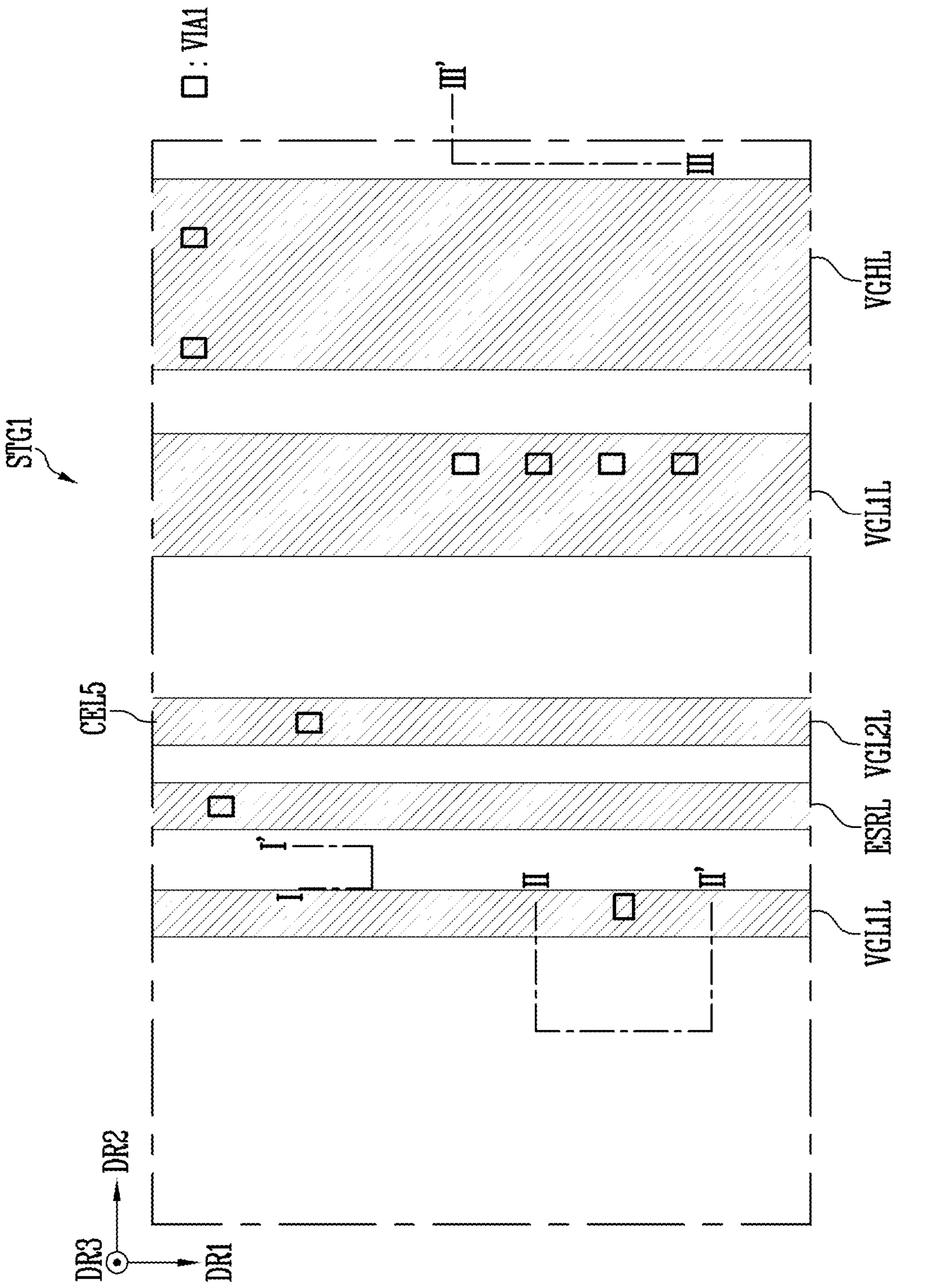

Referring to FIG. 16, an example of patterns of the fifth electrode layer CEL5 is shown. Some patterns of the fifth electrode layer CEL5 may include a first low voltage line VGL1L, a reset line ESRL, a second low voltage line VGL2L, and a high voltage line VGHL. The first low voltage VGL1 may be applied to the first low voltage line VGL1L, the second low voltage VGL2 may be applied to the second low voltage line VGL2L, the reset signal ESR may be applied to the reset line ESRL, and the high voltage VGH may be applied to the high voltage line VGHL.

Figure 17:
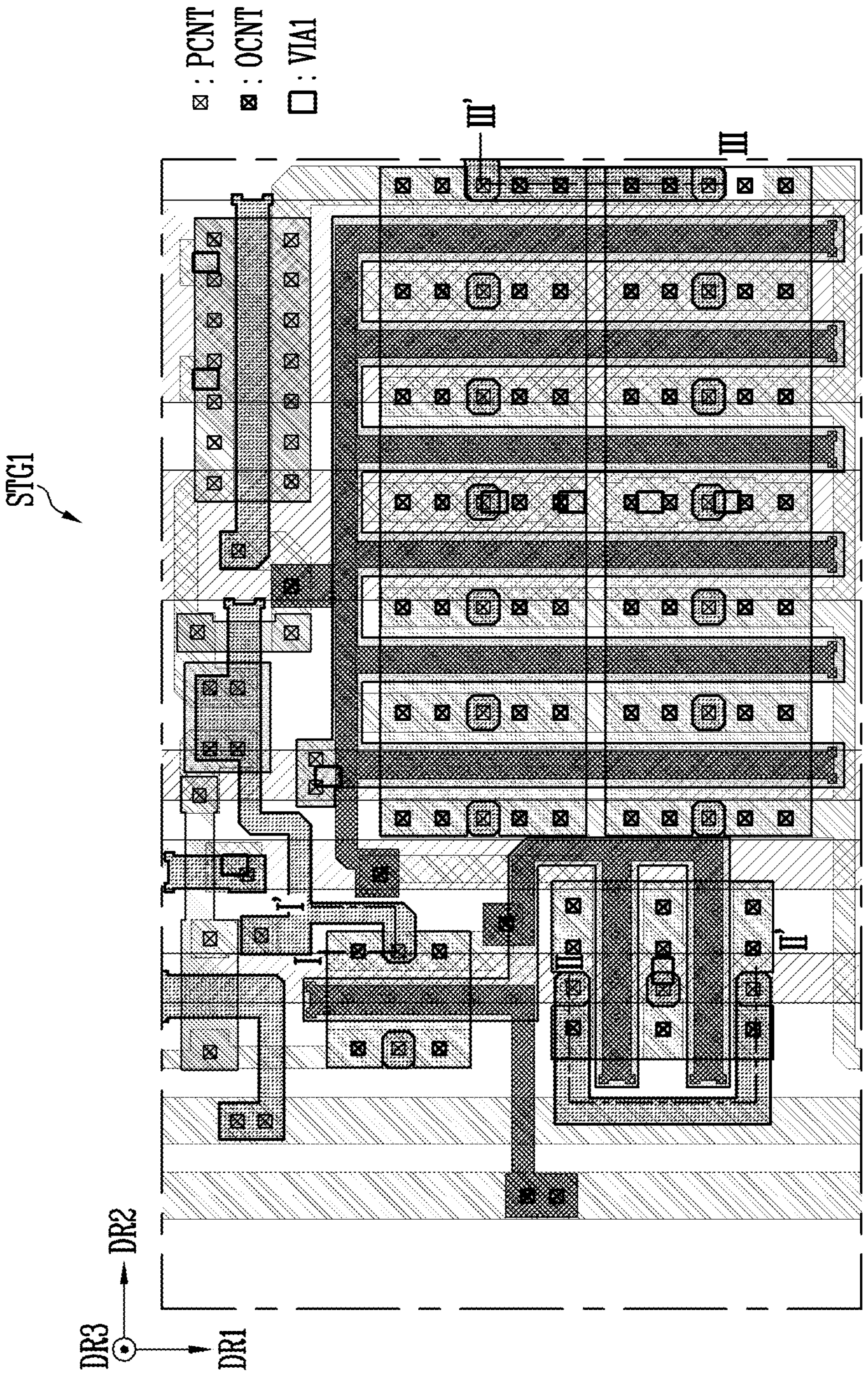

FIG. 17 is a reference schematic diagram showing all the layers shown in FIGS. 10 to 16 overlapping each other.

Figure 18:
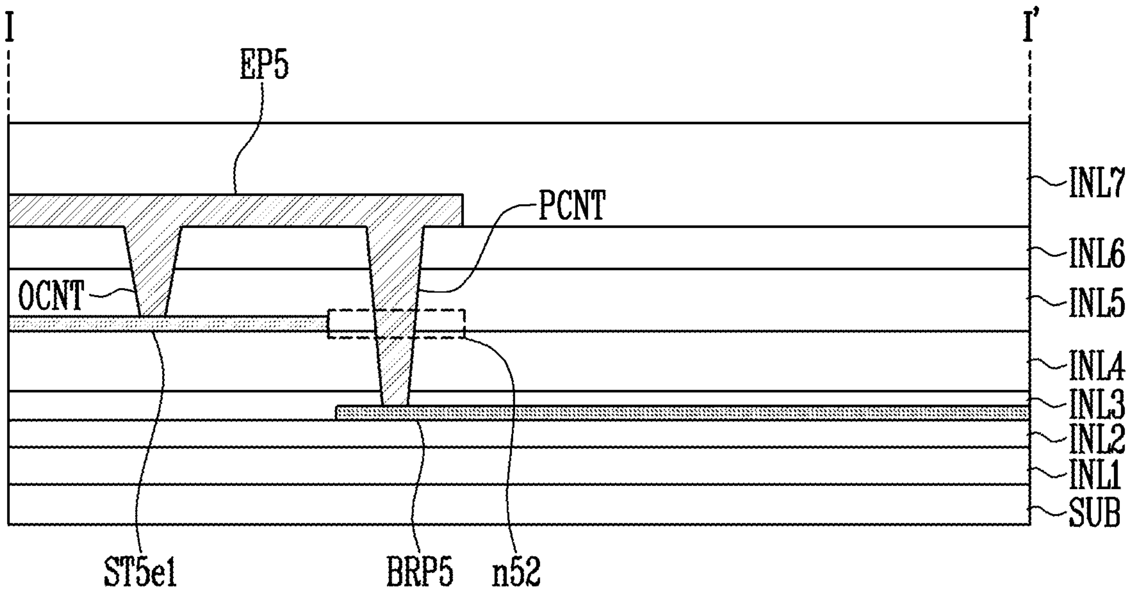
FIG. 18 is a schematic cross-sectional view taken along line I-I' in FIGS. 10 to 17.

FIG. 18 is a schematic cross-sectional view taken along line I-I' in FIGS. 10 to 17.

Referring to FIG. 18, the fifth transistor ST5 may include a semiconductor pattern located in the second active layer ACL2, a bridge pattern BRP5 located in the first electrode layer CEL1, and an electrode pattern EP5 located in the fourth electrode layer CEL4.

The semiconductor pattern may include the etched portion n52. The electrode pattern EP5 may connect the semiconductor pattern and the bridge pattern BRP5, but the electrode pattern EP5 may pass through the etched portion n52 of the semiconductor pattern and contact the bridge pattern BRP5.

The semiconductor pattern may include the first electrode ST5e1 of the fifth transistor ST5. The electrode pattern EP5 may contact the first electrode ST5e1 of the fifth transistor ST5.

The bridge pattern BRP5 may be connected to an electrode of a transistor other than the fifth transistor ST5. For example, the bridge pattern BRP5 may be connected to a gate electrode ST2g of the second transistor ST2 (see FIG. 11).

The second electrode ST5e2 of the fifth transistor ST5 may receive the scan start signal FLM or the scan signal of a previous stage (see FIGS. 13 and 15).

Figure 19:
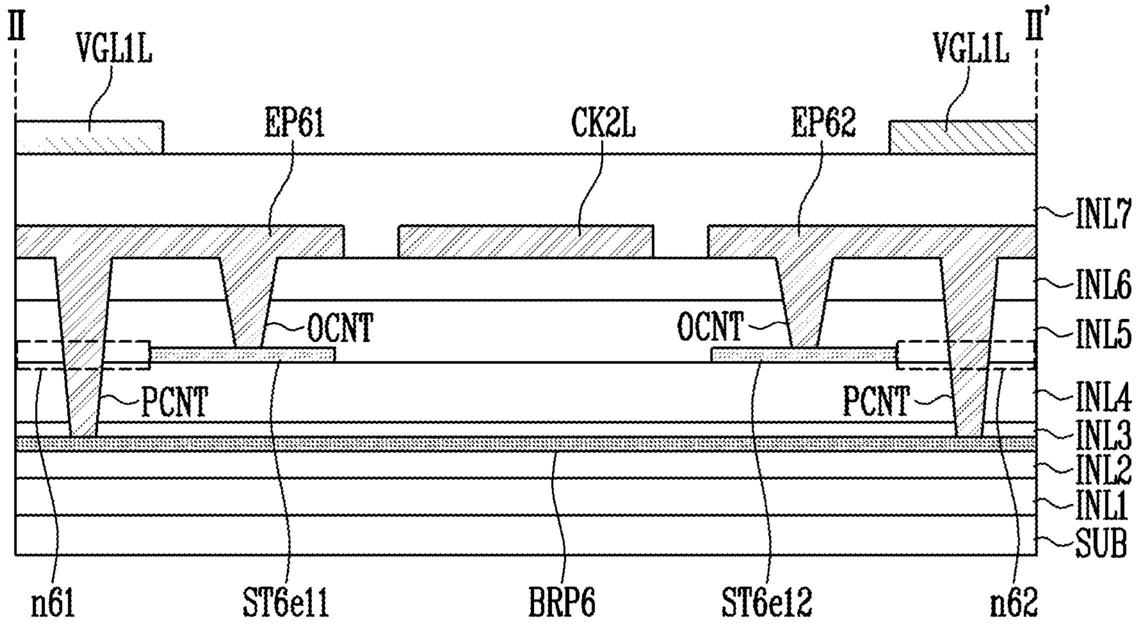
FIG. 19 is a schematic cross-sectional view taken along line II-II' in FIGS. 10 to 17.

FIG. 19 is a schematic cross-sectional view taken along line II-II' in FIGS. 10 to 17.

Referring to FIG. 19, the sixth transistor ST6 may include a semiconductor pattern located in the second active layer ACL2, a bridge pattern BRP6 located in the first electrode layer CEL1, and electrode patterns EP61 and EP62 located in the fourth electrode layer CEL4. The electrode patterns may include sub-electrode patterns EP61 and EP62 spaced apart from each other.

The semiconductor pattern may include the etched portions n61 and n62. The sub-electrode pattern EP61 may connect the semiconductor pattern and the bridge pattern BRP6, but the sub-electrode pattern EP61 may pass through the etched portion n61 of the semiconductor pattern and contact the bridge pattern BRP6. The sub-electrode pattern EP62 may connect the semiconductor pattern and the bridge pattern BRP6, but the sub-electrode pattern EP62 may pass through the etched portion n62 of the semiconductor pattern and contact the bridge pattern BRP6.

The semiconductor pattern may include the first electrode of the sixth transistor ST6. The first electrode of the sixth transistor ST6 may include the first sub-electrodes ST6e11 and ST6e12 spaced apart from each other. The sub-electrode patterns EP61 and EP62 may contact the corresponding first sub-electrodes ST6e11 and ST6e12, respectively. For example, the sub-electrode pattern EP61 may contact the first sub-electrode ST6e11, and the sub-electrode pattern EP62 may contact the first sub-electrode ST6e12. The bridge pattern BRP6 may connect the sub-electrode patterns EP61 and EP62.

The first electrode of the sixth transistor ST6 may be connected to a gate electrode of at least one of first semiconductor transistors TR1. For example, the first electrode of the sixth transistor ST6 may be connected to the gate electrode of the third transistor ST3 (see FIG. 7).

The first electrode of the sixth transistor ST6 may be further connected to a gate electrode of at least one of second semiconductor transistors TR2. For example, the first electrode of the sixth transistor ST6 may be connected to the gate electrode of the seventh transistor ST7 (see FIG. 7).

Figure 20:
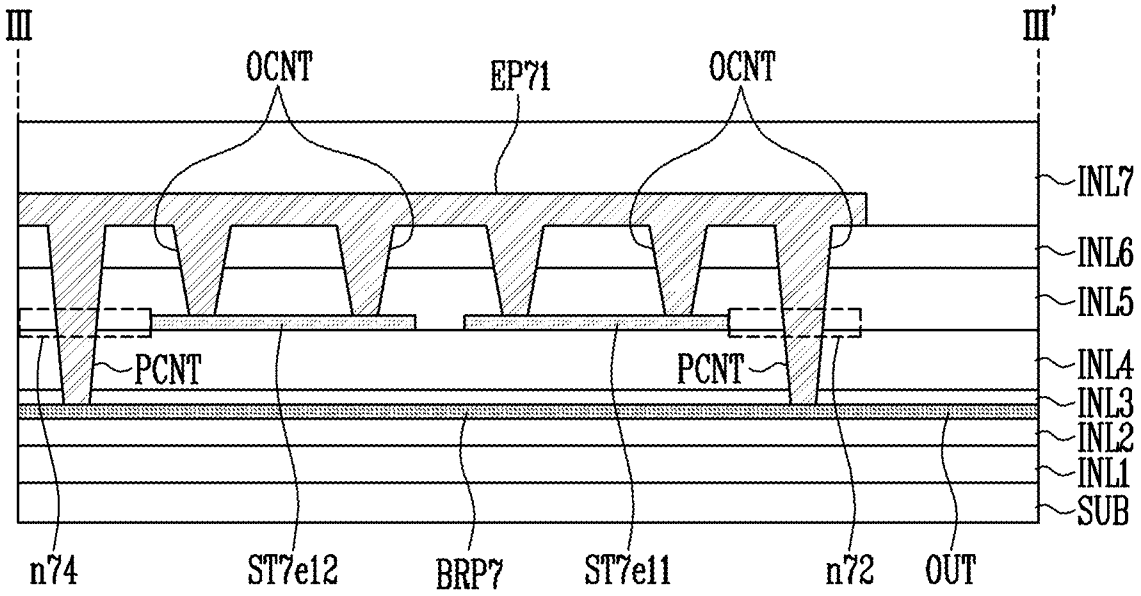
FIG. 20 is a schematic cross-sectional view taken along line III-III' in FIGS. 10 to 17.

FIG. 20 is a schematic cross-sectional view taken along line III-III' in FIGS. 10 to 17.

Referring to FIG. 20, the seventh transistor ST7 may include a semiconductor pattern located in the second active layer ACL2, a bridge pattern BRP7 located in the first electrode layer CEL1, and an electrode pattern EP71 located in the fourth electrode layer CEL4.

The semiconductor pattern may include etched portions n74 and n72. The electrode pattern EP71 may connect the semiconductor pattern and the bridge pattern BRP7, but the electrode pattern EP71 may pass through the etched portions n74 and n72 of the semiconductor pattern and contact the bridge pattern BRP7.

The semiconductor pattern may include the first electrode of the seventh transistor ST7. The first electrode of the seventh transistor ST7 may include the first sub-electrodes ST7e12 and ST7e11 spaced apart from each other. The electrode pattern EP71 may contact the first sub-electrodes ST7e12 and ST7e11 of the seventh transistor ST7.

The bridge pattern BRP7 may be a scan line connecting the pixel PXij and the scan driver 13S (see FIG. 11). For example, the scan line may be a conductive line extending from the output terminal OUT. For example, as described above, the emission driver 15 may be configured in the same manner as the scan driver 13S (see description of FIG. 6). Accordingly, the bridge pattern BRP7 may be an emission line connecting the pixel PXij and the emission driver 13S.

The seventh transistor ST7 may be connected to at least one of the plurality of first semiconductor transistors TR1. For example, the seventh transistor ST7 may be connected to the third transistor ST3 (see FIG. 7). The seventh transistor ST7 may be connected to at least one (for example, the third transistor ST3) of the first semiconductor transistors TR1 through the electrode pattern EP71 (see FIG. 15).

According to the present embodiment, the fifth, sixth, and seventh transistors ST5, ST6, and ST7 may form various connection structures using etched portions that are hydrogen exhaust ports. Therefore, dead space in the display device 10 or the scan driver 13S can be reduced.

According to the scan driver and the display device including the same according to the embodiments of the present invention, dead space can be minimized by using the hydrogen exhaust port as a contact hole.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
 a plurality of first semiconductor transistors having:
  a first semiconductor layer; and
  each semiconductor pattern of the first semiconductor transistors located in the first semiconductor layer; and
 a plurality of second semiconductor transistors having:
  a second semiconductor layer; and
  each semiconductor pattern of the second semiconductor transistors located in the second semiconductor layer which is located on the first semiconductor layer, wherein
 a first electrode layer is located between the first semiconductor layer and the second semiconductor layer,
 a second electrode layer is located on the second semiconductor layer, a first transistor among the second semiconductor transistors includes a first semiconductor pattern located in the second semiconductor layer, a bridge pattern located in the first electrode layer, and an electrode pattern located in the second electrode layer, the first semiconductor pattern includes an etched portion, the electrode pattern connects the first semiconductor pattern and the bridge pattern, and the electrode pattern contacts the bridge pattern by passing through the etched portion which is a notch or an opening of the first semiconductor pattern.

2. The display device of claim 1, wherein the etched portion is a hydrogen exhaust port.

3. The display device of claim 1, wherein the first semiconductor pattern includes a first electrode of the first transistor, and the electrode pattern contacts the first electrode of the first transistor.

4. The display device of claim 1, wherein the bridge pattern is connected to an electrode of a transistor other than the first transistor.

5. The display device of claim 1, wherein the first semiconductor pattern includes a first electrode of the first transistor, the first electrode of the first transistor includes first sub-electrodes spaced apart from each other, the electrode pattern includes sub-electrode patterns spaced apart from each other, the sub-electrode patterns contact corresponding first sub-electrodes, and the bridge pattern connects the sub-electrode patterns.

6. The display device of claim 1, wherein the bridge pattern is a scan line that connects a pixel and a scan driver.

7. The display device of claim 1, wherein the bridge pattern is an emission line that connects a pixel and an emission driver.

8. A scan driver comprising a plurality of stages including a plurality of first semiconductor transistors having:

a first semiconductor layer; and each semiconductor pattern of the first semiconductor transistors located in the first semiconductor layer; and a plurality of second semiconductor transistors having:

a second semiconductor layer; and each semiconductor pattern of the second semiconductor transistors located in the second semiconductor layer which is located on the first semiconductor layer, wherein a first electrode layer is located between the first semiconductor layer and the second semiconductor layer, a second electrode layer is located on the second semiconductor layer, a first transistor among the second semiconductor transistors includes a first semiconductor pattern located in the second semiconductor layer, a bridge pattern located in the first electrode layer, and an electrode pattern located in the second electrode layer, the first semiconductor pattern includes an etched portion, the electrode pattern connects the first semiconductor pattern and the bridge pattern, and the electrode pattern contacts the bridge pattern by passing through the etched portion which is a notch or an opening of the first semiconductor pattern.

9. The scan driver of claim 8, wherein the etched portion is a hydrogen exhaust port.

10. The scan driver of claim 8, wherein the first semiconductor pattern includes a first electrode of the first transistor, and the electrode pattern contacts the first electrode of the first transistor.

11. The scan driver of claim 8, wherein the bridge pattern is connected to an electrode of a transistor other than the first transistor.

12. The scan driver of claim 11, wherein a second electrode of the first transistor receives a scan start signal or a scan signal of a previous stage.

13. The scan driver of claim 8, wherein the first semiconductor pattern includes a first electrode of the first transistor, the first electrode of the first transistor includes first sub-electrodes spaced apart from each other, the electrode pattern includes sub-electrode patterns spaced apart from each other, the sub-electrode patterns contact corresponding first sub-electrodes, and the bridge pattern connects the sub-electrode patterns.

14. The scan driver of claim 13, wherein the first electrode of the first transistor is connected to a gate electrode of at least one of the plurality of first semiconductor transistors.

15. The scan driver of claim 14, wherein the first electrode of the first transistor is further connected to a gate electrode of at least one of the plurality of second semiconductor transistors.

16. The scan driver of claim 8, wherein the bridge pattern is a scan line.

17. The scan driver of claim 16, wherein the first transistor is connected to at least one of the plurality of first semiconductor transistors.

18. The scan driver of claim 17, wherein the first transistor is connected to at least one of the plurality of first semiconductor transistors through the electrode pattern.

* * * * *